United States Patent
Paulson et al.

(10) Patent No.: US 10,921,407 B2
(45) Date of Patent: Feb. 16, 2021

(54) SYSTEMS AND METHODS FOR MOTION MANAGEMENT IN MAGNETIC RESONANCE IMAGING GUIDED THERAPIES

(71) Applicant: THE MEDICAL COLLEGE OF WISCONSIN, INC., Milwaukee, WI (US)

(72) Inventors: Eric Paulson, Jackson, WI (US); Nikolai Mickevicius, Milwaukee, WI (US)

(73) Assignee: The Medical College of Wisconsin, Inc., Milwaukee, WI (US)

(*) Notice: Subject to any disclaimer, the term of this patent is extended or adjusted under 35 U.S.C. 154(b) by 30 days.

(21) Appl. No.: 16/090,388

(22) PCT Filed: Apr. 3, 2017

(86) PCT No.: PCT/US2017/025703
§ 371 (c)(1),
(2) Date: Oct. 1, 2018

(87) PCT Pub. No.: WO2017/173437
PCT Pub. Date: Oct. 5, 2017

(65) Prior Publication Data
US 2019/0113587 A1 Apr. 18, 2019

Related U.S. Application Data

(60) Provisional application No. 62/317,036, filed on Apr. 1, 2016.

(51) Int. Cl.
*G01R 33/483* (2006.01)
*G01R 33/48* (2006.01)
(Continued)

(52) U.S. Cl.
CPC ....... *G01R 33/4835* (2013.01); *G01R 33/482* (2013.01); *G01R 33/4808* (2013.01);
(Continued)

(58) Field of Classification Search
CPC ............ G01R 33/4816; G01R 33/4818; G01R 33/482; G01R 33/4822; G01R 33/4824;
(Continued)

(56) References Cited

U.S. PATENT DOCUMENTS 5,749,834 A  5/1998 Hushek
9,041,395 B2* 5/2015 Sorensen ........... G01R 33/4838
                                                324/309
(Continued)

OTHER PUBLICATIONS

The International Search Report and Written Opinion for International Patent Application No. PCT/US2017/025703 dated Aug. 2, 2017.
(Continued)

*Primary Examiner* — Tung X Nguyen
(74) *Attorney, Agent, or Firm* — Quarles & Brady LLP

(57) ABSTRACT

Described here are systems and methods for providing three-dimensional motion estimates prior to and during MRI-guided therapies. In general, these systems and methods can include simultaneous orthogonal plane imaging ("SOPI"), synthetic volumetric imaging ("SVI"), self-navigated phase-resolved 4D MRI, radial CAIPIRINHA, and combinations thereof.

49 Claims, 12 Drawing Sheets

(51) Int. Cl.
*G01R 33/56* (2006.01)
*G01R 33/561* (2006.01)
*G01R 33/565* (2006.01)
*G01R 33/567* (2006.01)

(52) U.S. Cl.
CPC ..... *G01R 33/4826* (2013.01); *G01R 33/5601* (2013.01); *G01R 33/5611* (2013.01); *G01R 33/5676* (2013.01); *G01R 33/56509* (2013.01)

(58) Field of Classification Search
CPC ............ G01R 33/4826; G01R 33/4828; G01R 33/483; G01R 33/4831; G01R 33/4833; G01R 33/4835; G01R 33/4836; G01R 33/4838; G01R 33/50; G01R 33/543; G01R 33/5602; G01R 33/5604; G01R 33/5605; G01R 33/5607; G01R 33/5608; G01R 33/561; G01R 33/5611; G01R 33/5612; G01R 33/5613; G01R 33/5614; G01R 33/5615; G01R 33/5616; G01R 33/5617; G01R 33/5618; G01R 33/5619; G01R 33/563; G01R 33/56308; G01R 33/56316; G01R 33/56325; G01R 33/56333; G01R 33/56341; G01R 33/5635; G01R 33/56358; G01R 33/56366; G01R 33/56375; G01R 33/56383; G01R 33/56391; G01R 33/565; G01R 33/56509; G01R 33/56518; G01R 33/56527; G01R 33/56536; G01R 33/56545; G01R 33/56554; G01R 33/56563; G01R 33/56572; G01R 33/56581; G01R 33/5659; G01R 33/567; G01R 33/5673; G01R 33/5676
See application file for complete search history.

(56) References Cited

U.S. PATENT DOCUMENTS

| | | |
|---|---|---|
| 2001/0018558 A1 | 8/2001 | Suzuki et al. |
| 2005/0073304 A1 | 4/2005 | Feiweier et al. |
| 2009/0123384 A1* | 5/2009 | Wald ............... G01R 33/5601 424/9.32 |
| 2010/0097061 A1 | 4/2010 | Zhu et al. |
| 2014/0225612 A1 | 8/2014 | Polimeni et al. |

OTHER PUBLICATIONS

Hardy. Peter et al., "Optimization of a Dual Echo in the Steady Slaie (DESS) Free-Precession Sequence for Imaging Cartilage," Journal of Magnetic Resonance Imaging; 1996 (1996), pp. 339 [online], [retrieved on Jul. 12, 2017] cURL;https://www.acadomia.edU/11088231/OptImfeation_ot_a_dual echo_In_the_sleady_stale_DESS_free-precession_sequence_forJmaging_cartllage>.

Feinberg, D.A. e t al. "Simultaneous Image Refocusing (SIR): a New Approach to Multi-slice MRI." Proc. Intl. Sot. Mag. Reson. Med, 8, 2000 (2000), pp. 681 [online], [retrieved on Jul. 12, 2017] <URL: http://cds.ismrm.org/ismrm-2000/PDF3/0681.pdf>.

Ramb, Rebecca, "k-t-sub-Nyquist sampled Parallel Echo Planar Imaging in MRI." Albert-Ludwigs-Universitat, Feb. 2016 (Feb. 2016), pp. 83, 85-86 [online], [retrieved on Jul. 12, 2017] <URL: https://freidok.uni-freiburg.d8/dnb/download/11129>.

Mickevicius, Nikolai et al., "Simultaneous Orthogonal Plane Imaging." Magnetic Resonance in Medicine, Oct. 2016, pp. 1-10 [online], [retrieved on Jul. 11, 2017] <URL: https://www.ncbi.nlm.nih.gov/pubmed/27917527>.

* cited by examiner

SYSTEMS AND METHODS FOR MOTION MANAGEMENT IN MAGNETIC RESONANCE IMAGING GUIDED THERAPIES

CROSS-REFERENCE TO RELATED APPLICATIONS

This application represents the national stage entry of PCT International Application No. PCT/US2017/025703 filed on Apr. 3, 2017, which claims the benefit of U.S. Provisional Patent Application Ser. No. 62/317,036, filed on Apr. 1, 2016, and entitled "SYSTEMS AND METHODS FOR MOTION MANAGEMENT IN MAGNETIC RESONANCE IMAGING GUIDED THERAPIES," all of which are herein incorporated by reference in their entirety.

BACKGROUND

Magnetic resonance imaging ("MRI") can be used to guide interventional procedures and therapies, including MRI-guided radiotherapy ("MRI-gRT") and MRI-guided high intensity focused ultrasound ("MRI-gHIFU"). Integrated MRI-gRT systems have the potential to transform radiotherapy from a sequential treatment preparation, planning, and delivery process to a continuous cycle that adapts to inter- and intra-fractional changes before, during and after treatment of a patient. The success of radiotherapy is largely dependent on the alignment of the treatment field with the target. Motion during treatment can arise from semi-periodic (e.g., respiration, peristalsis, cardiac) and/or aperiodic (e.g., cough, sneeze, bulk movement) motion. Motion management in radiation therapy involves two components: (1) generation of high-fidelity static images of targets and organs at risk along with models of respiratory motion for use in treatment planning and (2) real-time intra-fraction motion monitoring for exception gating, tracking, online adaptive replanning, and dose accumulation during treatment delivery. Even with the latest MRI technologies, including parallel imaging, multiband excitation, and compressed sensing, several challenges remain.

SUMMARY OF THE DISCLOSURE

The present disclosure addresses the aforementioned drawbacks by providing systems and methods for providing three-dimensional motion estimates prior to and during MRI-guided therapies.

It is one aspect of the present disclosure to provide a method for acquiring magnetic resonance data using a magnetic resonance imaging ("MRI") system by performing a pulse sequence with the MRI system. The pulse sequence includes a first radio frequency ("RF") excitation pulse that excites spins in a first slice; a first slice encoding gradient produced along a first axis and contemporaneous with the first RF excitation pulse to provide slice encoding of the spins in the first slice; a second RF excitation pulse that excites spins in a second slice that is orthogonal to the first slice; and a second slice encoding gradient produced along a second axis that is orthogonal to the first axis and contemporaneous with the second RF excitation pulse to provide slice encoding of the spins in the second slice. The pulse sequence also includes a first phase encoding gradient produced along the first axis to provide phase encoding of spins in the second slice; a second phase encoding gradient produced along the second axis to provide phase encoding of spins in the first slice; and a frequency encoding gradient produced along a third axis that is orthogonal to the first axis and the second axis, and that forms a first echo signal at a first echo time and a second echo signal at a second echo time. The first echo signal is associated with spins in the first slice and the second echo signal is associated with spins in the second slice. First data are acquired from the first echo signal with the MRI system, the first data being associated with the first slice, and second data are acquired from the second echo signal with the MRI system, the second data being associated with the second slice.

It is another aspect of the present disclosure where the pulse sequence implement multiband RF excitation pulses to simultaneously excite spins in a plurality of slices that are either parallel to the first slice, the second slice, or both.

It is another aspect of the present disclosure where the pulse sequence can additionally include a third RF excitation pulse that excites spins in a third slice that is orthogonal to the first slice and the second slice; a third slice encoding gradient produced along the third axis and contemporaneous with the third RF excitation pulse to provide slice encoding of the spins in the third slice; a third phase encoding gradient produced along the first axis to provide phase encoding of spins in the third slice; and a second frequency encoding gradient produce along the second axis to form a third echo signal at a third echo time, wherein the third echo signal is associated with spins in the third slice. Third data are then acquired from the third echo signal with the MRI system, the third data being associated with the third slice.

It is another aspect of the present disclosure that the first data and second data can be processed to estimate k-t space weights. These k-t space weights can be used to reconstruct images from magnetic resonance data acquired by interleaved data acquisition between two different orthogonal imaging planes, such that the magnetic resonance data represent an undersampled k-t space. Such data can be non-T1-weighted data, such as data acquired with a balanced steady-state free precession ("bSSFP") pulse sequence that alternates excitation and data acquisition between the two different orthogonal imaging planes.

It is another aspect of the present disclosure to provide a method for producing low latency three-dimensional volumes using an MRI system. The MRI system is operated to acquire k-space data from a plurality of different slices in a subject, and a motion surrogate signal is estimated from the k-space data that were sampled within a threshold distance from a center of k-space. An average respiratory waveform associated with the subject is provided and low latency three-dimensional volumes are generated based on a relation of the motion surrogate signal and the average respiratory waveform.

It is an aspect of the present disclosure that the average respiratory waveform can be provided by retrospectively binning the k-space data into respiratory phase bins using the estimated motion surrogate signal and computing the average respiratory waveform by interpolating an average motion surrogate signal value over the respiratory phase bins to a higher temporal resolution.

It is another aspect of the present disclosure that generating the low latency three-dimensional volumes can include determining a maximum relation value between the motion surrogate signal and the average respiratory waveform, and using the maximum relation value and the respiratory phase bin associated with maximum relation value to generate a low latency three-dimensional volume. The maximum relation value can be a maximum correlation value.

It is an aspect of the present disclosure that the k-space data can be acquired using a radial CAIPIRINHA method that simultaneously acquires k-space data from the plurality of different slices along radial spoke k-space trajectories. The motion surrogate signal can be estimated from such k-space data sampled at the center of k-space data by the radial spoke k-space trajectories.

It is another aspect of the present disclosure that the plurality of different slices can include at least a first slice depicting a first image plane and a second slice depicting a second image plane that is orthogonal to the first image plane. The k-space data can be acquired by acquiring k-space data from the first image plane and the second image plane by slice encoding spins in the first image plane using magnetic field gradients applied along a first axis and phase encoding the spins in the first image plane using magnetic field gradients applied along a second axis that is orthogonal to the first axis, while slice encoding spins in the second image plane using magnetic field gradients applied along the second axis and phase encoding the spins in the second image plane using magnetic field gradients applied along the first axis. The motion surrogate signal can be estimated from such k-space data by producing a pseudo-projection from the k-space data that were sampled within the threshold distance from the center of k-space and producing the motion surrogate signal from a waveform over time extracted from the pseudo-projection.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
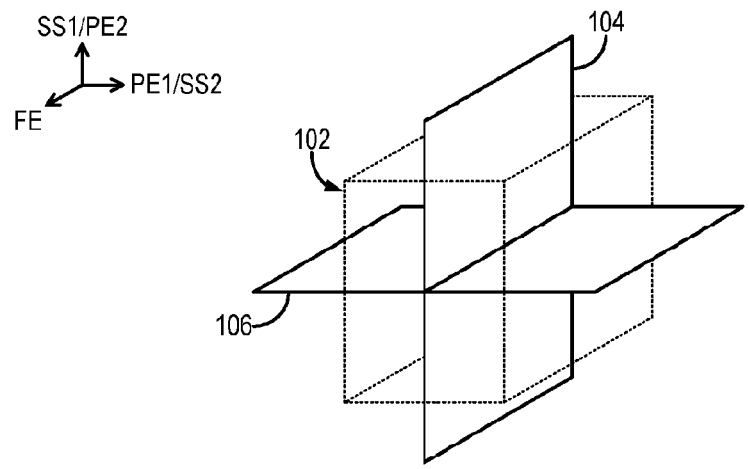
FIG. 1 illustrates an example simultaneous orthogonal plane imaging ("SOPI") acquisition scheme, in which data are acquired from two orthogonal slices in a single acquisition.

Described here are systems and methods for providing three-dimensional motion estimates prior to and during MRI-guided therapies. In general, these systems and methods can include simultaneous orthogonal plane imaging ("SOPI"), synthetic volumetric imaging ("SVI"), self-navigated phase-resolved 4D MRI, radial CAIPIRINHA, and combinations thereof.

Described now are methods for simultaneous orthogonal plane imaging ("SOPI"). SOPI can include any number of pulse sequences that are adapted to acquire data from two orthogonal slices. Such implementations allow for rapidly imaging a moving target in two orthogonal planes simultaneously. Using this imaging technique, more spatial information about the object being image can be obtained in a single acquisition, motion of the underlying object can be captured in plane along all three orthogonal directions, and images that are free of intra-slice motion artifacts can be reconstructed. The improved visualization of the target and nearby structures can also be used to aid in the monitoring of intrafraction motion and to improve the accuracy of dose delivery.

Anticipating and measuring respiratory motion during a fraction of radiation therapy is crucial to deposit the intended dose. Simultaneous orthogonal slice imaging will aid in the measurement of these motions in real time and improve the accuracy of radiation delivery by eliminating interslice motion seen in interleaved orthogonal plane cine acquisitions.

Motion prediction algorithms used for gating and tracking benefit from extremely low latency information. While the SOPI images are acquired at a reasonable frame rate, a high temporal resolution motion surrogate inherent to the MRI sequence is to be desired. The use of pseudo-projection navigation can thus be implemented with the SOPI sequence to provide motion surrogate signals. In this technique, phase encoding lines within a predefined region near the center of k-space are filtered and used to generate a 1D projection of the moving anatomy.

In addition to radiation therapy, other MRI-guided therapies or interventions like high-intensity focused ultrasound ("HIFU"), brachytherapy, or intraoperative MRI would be benefit from real-time SOPI imaging when targeting moving structures in the abdomen. For example, the simultaneous acquisition of data from orthogonal slices can allow for generating proton resonance frequency shift thermometry maps in moving structures. Such temperature maps can be generated from the phase difference between the images acquired at different echo times, for instance.

SOPI could also be an asset to the cardiac imaging field. Long-axis and short-axis cardiac images are often acquired during perfusion imaging to look at the uptake of contrast in more than one plane. A cardiac-gated SOPI scan would enable orthogonal images in the long-axis and short-axis to be acquired at the same time point in the cardiac cycle.

In 2D Cartesian gradient echo sequences, the echo time is defined as the difference in time between excitation ($t_{ISO}$) and when the zeroth gradient moment along the frequency encoding direction ($m_{FE}$) is zero. To maximize the received signal, the zeroth gradient moment along the slice select direction ($m_{SS}$) should be zero throughout the duration of the readout gradient. Also, to spatially encode the image, the zeroth gradient moment along the phase encoding direction ($m_{PE}$) should be the moment needed for the given phase encode line (P). Mathematically, the zeroth gradient moment ($m_0$) can be described as follows:

$$m_0(TE) = \int_{T_{ISO}}^{TE} G(t)dt = \begin{bmatrix} m_{SS} \\ m_{FE} \\ m_{PE} \end{bmatrix} = \begin{bmatrix} 0 \\ 0 \\ P \end{bmatrix}. \quad (1)$$

Based on this principle, a data acquisition scheme in which orthogonal slices are simultaneously encoded can be designed. In such acquisitions, the slice select direction for one slice is selected to be the phase encode axis of the corresponding orthogonal slice, and vice versa. The orthogonal slices then share a frequency encoding direction.

An example of a SOPI acquisition scheme is shown in FIG. 1, where an object 102 is simultaneously imaged in two orthogonal slices 104, 106. In this example, the first slice 104 is spatially encoded using slice encoding along the z-direction, phase encoding along the y-direction, and frequency encoding along the x-direction. The second slice 106 is then spatially encoded using slice encoding along the y-direction, phase encoding along the z-direction, and frequency encoding along the x-direction. It will be appreciated that the directions associated with the slice, phase, and frequency encodings in this example are selected for illustrative purposes, and that the various encoding directions can be aligned any three arbitrary orthogonal directions. The directions can thus be more generally referred to as the first slice encoding direction (SS1), which is also the second phase encoding direction (PE2); the first phase encoding direction (PE1), which is also the second slice encoding direction (SS2); and the frequency encoding direction (FE).

Figure 2:
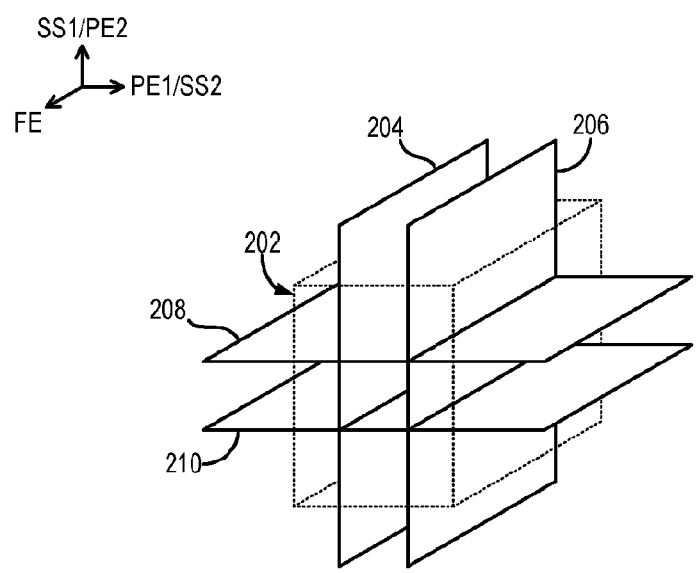
FIG. 2 illustrates an example multiplexed SOPI ("mSOPI") acquisition scheme, in which data are simultaneously acquired from multiple slices along two orthogonal axes in a single acquisition.

In general, a SOPI pulse sequence can be adapted for simultaneous multislice imaging by replacing single-band RF pulses with multiband RF pulses to simultaneously excite more than one slice on each orthogonal axis. Such implementations of SOPI may be referred to as multiplexed SOPI (mSOPI). An example of a multiplexed SOPI acquisition scheme is shown in FIG. 2, where an object 202 is simultaneously imaged in a first slice 204 and a second slice 206 that is parallel to the first slice 204, and in a third slice 208 and a fourth slice 210 that is parallel to the third slice 208. Both the third slice 208 and the fourth slice 210 are orthogonal to the first slice 204 and the second slice 206. Although the example in FIG. 2 illustrates two slices being simultaneously excited along a given orthogonal axis (i.e., SS1 or SS2), it will be appreciated that with the appropriate multiband RF pulse, more than two slices can be excited along a given orthogonal axis.

In the example shown in FIG. 2, the first slice 204 and second slice 206 are spatially encoded using slice encoding along a first slice encoding axis, SS1; using phase encoding along a first phase encoding axis, PE1; and using frequency encoding along a frequency encoding axis, FE. The third slice 208 and the fourth slice 210 are spatially encoded using slice encoding along a second slice encoding axis, SS2, which is the same as the first phase encoding axis, PE1; using phase encoding along a second phase encoding axis, PE2, which is the same as the first slice encoding axis, SS1; and using frequency encoding along the same frequency encoding axis, FE, as the first slice 204 and the second slice 206.

The SOPI pulse sequences described in the present disclosure acquire images in two orthogonal imaging planes; however, the sequences can also be adapted to acquire images in a third orthogonal imaging place. In these instances, a separate readout gradient would be applied along the slice select axis of one of the other two orthogonal slice groups. Thus, as one example, the spatial encoding for the first and second orthogonal imaging planes would be as described above, but spatial encoding for the third orthogonal imaging plane would be implemented using slice encoding along the frequency encoding direction (FE) with phase encoding along either the SS1/PE2 or SS2/PE1 direction, and frequency encoding then along either the SS2/PE1 or SS1/PE2 direction.

Two example SOPI pulse sequences are provided below. Expressions for the zeroth gradient moments of the lobes shown in these examples are also derived. Although the pulse sequences described below implement Cartesian sampling of k-space, SOPI pulse sequences can also be adapted for radial or spiral readout trajectories to provide additional robustness to intraslice motion artifacts.

Figure 3:
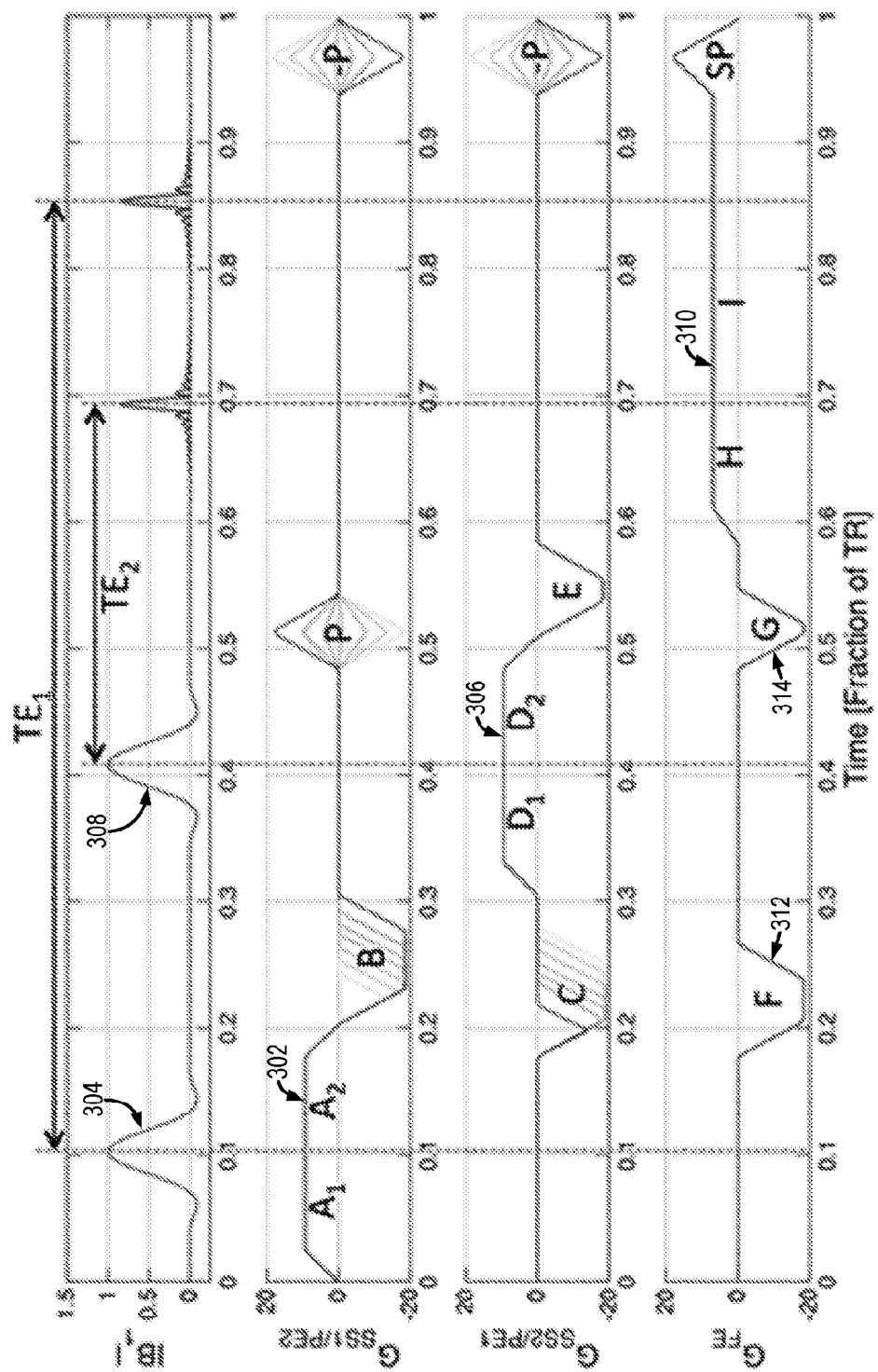
FIG. 3 is an example of a simultaneous orthogonal plane imaging ("SOPI") pulse sequence with non-equal echo times ("nETE").

One example SOPI pulse sequence described in the present disclosure is a non-equal echo time (nETE) spoiled gradient (SPGR) SOPI pulse sequence. A pulse sequence diagram for this example implementation is shown in FIG. 3. In this pulse sequence, slices are sequentially exited on orthogonal axes. Each slice is phase encoded along the slice select axis of the other slice. An extended readout gradient refocuses separate gradient echoes for each slice in the reverse of the order in which they were excited, which results in unequal echo times between the slices. Phase rewinder and readout spoiler gradients can be played after the readout plateau ends. In some embodiments, In the pulse sequence shown in FIG. 3, gradient moments A1 and A2 are been defined to be the gradient lobe areas (including ramps) of the first slice selection gradient 302 separated by the isocenter of the first RF pulse 304. Gradient lobes D1 and D2, likewise, are the gradient lobe areas of the second slice select gradient 306 separated by the isocenter of the second RF pulse 308. For simplicity, both orthogonal slices are to be phase encoded with the same gradient moment of P, though different phase encoding lines for both slices can be sampled within the same repetition time (TR) period. The gradient moment of gradient lobes B and C are dependent on the current k-space line.

The net gradient-induced phase accumulation of the first slice along the SS1/PE2 axis should be zero by the beginning of the readout gradient 310. Given that the second slice also must have accumulated a gradient moment of P by the beginning of the readout gradient 310, the following expression can be given for the zeroth gradient moment in gradient lobe B:

$$B = -A_1 - P \quad (2).$$

The phase accumulated in the second slice after the second RF pulse isocenter should be rewound prior to readout. Therefore:

$$E = -D_2 \qquad (3).$$

Also, the moment of the first slice along the SS2/PE1 axis should be the phase encoding moment, P, before the beginning of the readout. With this constraint, the zeroth gradient moment in gradient lobe C can be expressed as follows:

$$C = -D_1 + P \qquad (4).$$

With a simultaneous image refocusing (SIR) readout, the gradient echo signals S1 and S2 are acquired at non-overlapping portions of the readout gradient 310, which has an amplitude calculated based on the bandwidth and field-of-view (FOV). The SOPI sequence with a SIR readout is fastest when the gradient echo for the second slice occurs before that of the first slice. The following prephaser gradient moments are used for this type of readout.

$$F_{nETE} = -I \qquad (5);$$

$$G_{nETE} = -H \qquad (6).$$

With these frequency encoding prephaser gradients (312, 314), the echo time between the two slices is not equal. If an even faster acquisition is desired, the gradient echoes from the orthogonal slices may be acquired in an aliased (e.g., in which the echoes are combined) manner during the same portion of a non-extended readout gradient. In this case, only the prephaser gradient lobe 314 after the second excitation 308 needs to be applied, resulting in the following gradient lobe areas:

$$F_{nETE,Aliased} = 0 \qquad (7);$$

$$G_{nETE,Aliased} = H \qquad (8);$$

$$I_{nETE,Aliased} = 0 \qquad (9).$$

In a SOPI pulse sequence with a readout that results in aliasing as described above, the orthogonal slices will be superimposed in the reconstructed image. While coil sensitivity differences of overlapping voxels of orthogonal slices should be significantly greater than those in overlapping pixels of parallel slices, image quality can still be improved by applying a CAIPIRINHA RF phase cycling pattern that shifts one of the slices relative to the other within the FOV to reduce the number of superimposed voxels.

In some implementations of the nETE SOPI acquisitions, the flip angle of the two RF pulses can be adjusted so the orthogonal images (with different echo times) have more similar contrast to noise ratio for a given TR.

The order in which orthogonal slice groups are excited when using an nETE SOPI acquisition can be swapped from one repetition to the next. In these implementations, the echo time of each orthogonal slice group will change between repetitions.

In some embodiments, the free induction signal pathway can be crushed for both orthogonal slices, or slice groups, by applying a crusher gradient along the readout axis before the readout gradient is applied.

Although the example described above implements an SPGR pulse sequence, it will be appreciated by those skilled in the art that other pulse sequences can be adapted and implemented for a SOPI acquisition. For example, a reversed fast imaging in steady-state precession (reversed FISP, or PSIF) pulse sequence can also be implemented. Like the SPGR pulse sequence described above, in a PSIF pulse sequence adapted for SOPI, slices are sequentially exited on orthogonal axes, and each slice is phase encoded along the slice select axis of the other slice.

Figure 4:
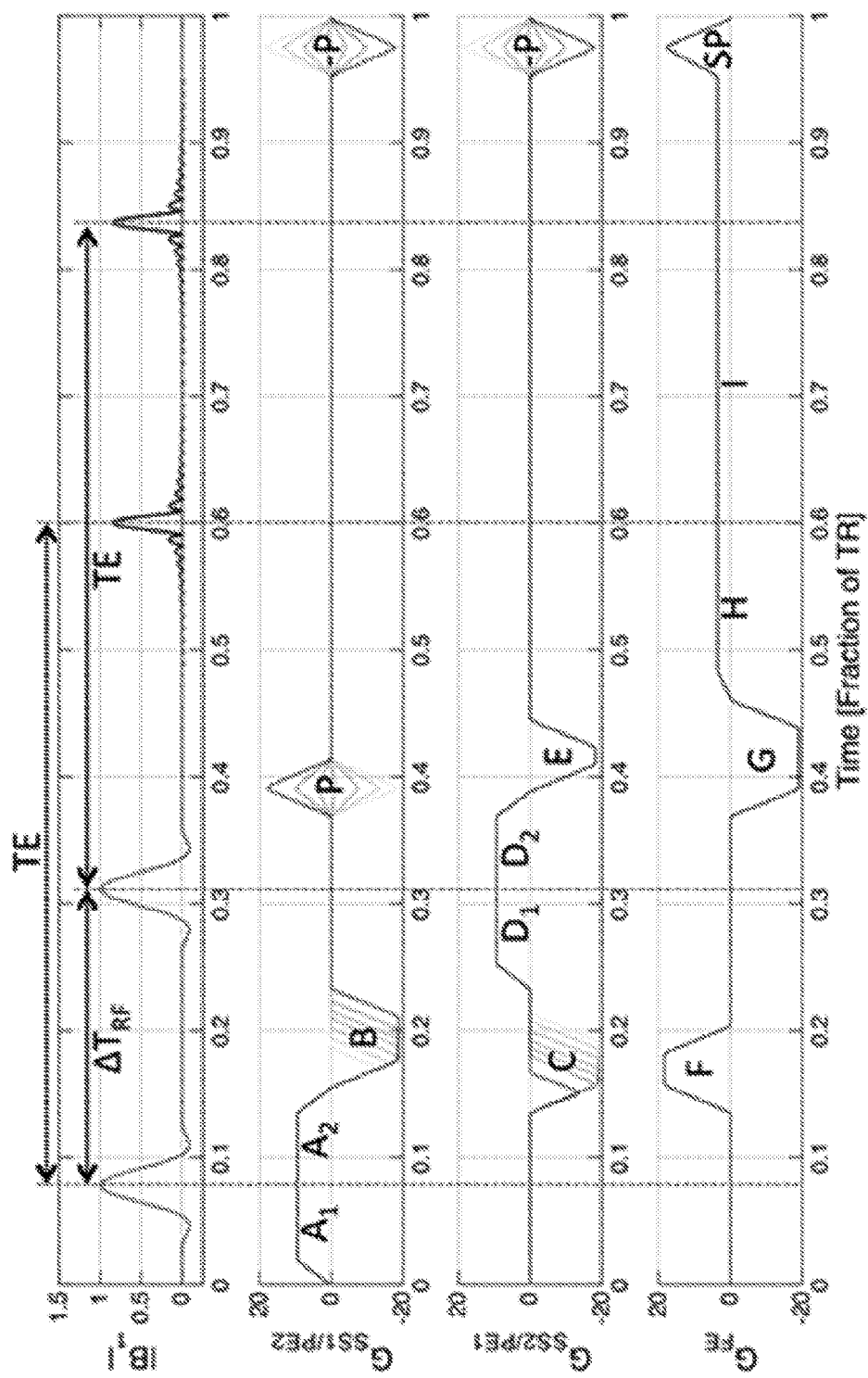
FIG. 4 is an example of a simultaneous orthogonal plane imaging ("SOPI") pulse sequence with equal echo times ("ETE").

Another example SOPI pulse sequence described in the present disclosure is an equal echo time (ETE) SPGR SOPI pulse sequence. A pulse sequence diagram for this example implementation is shown in FIG. 4. In this pulse sequence, slice selection and phase encoding are performed as in the nETE SPGR SOPI sequence described above. The frequency encoding prephaser gradients (F and G) and the readout bandwidth are adjusted to ensure the gradient echo for each slice occurs in the order in which they were excited and with the same echo time.

The ETE SOPI pulse sequence may be designed by adjusting the prephaser amplitudes and the readout bandwidth such that the time between gradient echoes is equal to the time between the isocenters of the RF pulses ($\Delta TRF$):

$$F_{ETE} = I; \qquad (10)$$

$$G_{ETE} = -H - I; \qquad (11)$$

$$bw_{ETE} = \frac{N}{\Delta T_{RF}}; \qquad (12)$$

where N is the number of pixels in the frequency encoding direction. With these parameters, the orthogonal slices are rephased in the order in which they were excited, and the adjusted bandwidth assures that the echo time of each slice is identical. The phase encoding and slice select rewinding gradients remain unchanged from the nETE SPGR SOPI sequence.

In spoiled gradient recalled echo sequences (e.g., SPGR, FLASH), phase rewinding gradient lobes are played immediately after the readout. In the SPGR SOPI sequences, these gradients (-P) are played on the SS1/PE2 and SS2/PE1 axes. A spoiler gradient (SP) with the same polarity of the readout gradient is also played concurrently.

The regions where slices intersect each other inside the target can lead to saturation regions running along the frequency encoding direction representing the slice profile of the corresponding orthogonal slice. If a smaller region of saturated signal is desired (e.g., for smaller targets like the pancreas), the tradeoff is acquisition speed. To excite a thinner slice, a larger gradient amplitude is needed, and thus a larger slice rewinder gradient is also needed. This effectively increases the duration of time between the two RF pulses and stretches the minimum achievable TE and TR.

Fat suppression can be implemented in the SOPI pulse sequences described in the present disclosure. This fat suppression can further improve image contrast and target delineation.

The SOPI pulse sequences described in the present disclosure can also be adapted to implement RF pulses with a short duration and extremely low bandwidth that still maintain good slice profiles. This implementation would decrease the time between the two RF pulses, leading to a shorter minimum TE and TR, and to higher frame rates.

Although the example described above implements an SPGR pulse sequence, it will be appreciated by those skilled in the art that other pulse sequences can be adapted and implemented for a SOPI acquisition. For example, a reversed fast imaging in steady-state precession (reversed FISP, or PSIF) pulse sequence can also be implemented. Like the SPGR pulse sequence described above, in a PSIF pulse sequence adapted for SOPI, slices are sequentially exited on orthogonal axes, and each slice is phase encoded along the slice select axis of the other slice.

In general, a SOPI pulse sequence can be adapted for simultaneous multislice imaging by replacing single-band RF pulses with multiband RF pulses to simultaneously excite more than one slice on each orthogonal axis. Such implementations of SOPI may be referred to as multiplexed SOPI (mSOPI). By exploiting variations in coil sensitivity profiles, the aliased parallel slices along each orthogonal axis may be separated. CAIPIRINHA phase modulations of at least one slice on each orthogonal axis may be used to improve the separation of the slices.

For example, in CAIPIRINHA acquisitions, RF phase ramps are applied along the phase encode (PE) direction with slope $m_{CAIPI}$ (defined here with units of radians per PE line) and intercept $b_{CAIPI}$. In an example mSOPI pulse sequence, one slice on each orthogonal axis can be selected with $m_{CAIPI}=0$ rad/PE and $b_{CAIPI}=0$ rad. The second slice on each orthogonal axis can then be shifted by a percentage of the field-of-view, such as one-half the field-of-view (i.e., FOV/2), and acquired in quadrature relative to the first slice with $m_{CAIPI}=\pi$ rad/PE and $b_{CAIPI}=\pi/2$ rad. In consecutive repetitions, $b_{CAIPI}$ on the shifted slice can be incremented by $\pi$ radians (i.e., $b_{CAIPI}$ on the shifted slice alternated as $+\pi/2$, $-\pi/2$, $+\pi/2$, ...).

As one specific example, a multiplexed SOPI sequence with an SPGR and a SIR readout was designed and implemented. The orthogonal slices to be acquired simultaneously were prescribed graphically on the anatomy of interest. A flag was added to select an ETE or nETE acquisition. To reduce scan time, an in-plane GRAPPA acceleration was implemented. Both GRAPPA and partial Fourier acquisition capability was added to the sequence. Externally loaded one-band and two-band phase-controlled Shinnar-Le Roux RF pulses of length 0.6 ms and slice bandwidth 2 kHz were used in the these non-limiting example SOPI pulse sequences. Flexible coils were wrapped around the phantom/subject and elements of the spine array built into the table were used. A total number of receive coils ranging from 18 to 24 were used for the imaging experiments.

When the SOPI pulse sequence is used for imaging moving anatomy, it may not be sufficient to use a single reference scan to obtain calibration data to separate aliased slices. In such instances, an autocalibrating acquisition and phase-constrained 2D-SENSE-GRAPA reconstruction process can be implemented for mSOPI.

Figure 5:
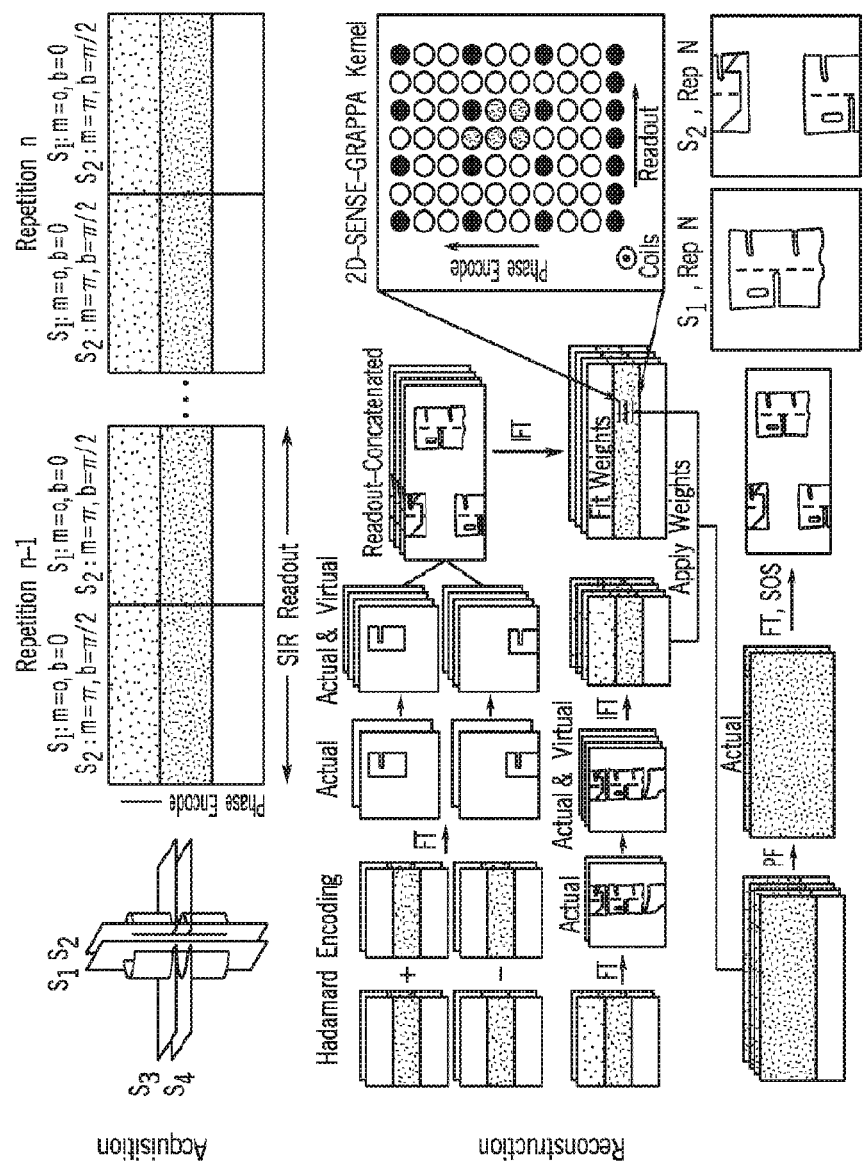
FIG. 5 is a flow diagram setting forth the steps of an example method for acquiring data using a multiplexed SOPI acquisition and reconstructing images from that acquired data.

Referring now to FIG. 5, a flow diagram is illustrated as setting forth the steps of an example method for acquiring data using a multiplexed SOPI pulse sequence and for reconstructing images from such data.

Data are acquired from a subject using a multiplexed SOPI acquisition. As an example, the data can be acquired using multiplexed SOPI acquisition such as the one described above. Additional acceleration techniques can also be implemented, such as by using partial Fourier (PF) encoding an in-plane acceleration (e.g., by skipping phase encoding lines). Using the acquisition described above, an RF phase ramp will shift one slice along each axis within the FOV. The intercept of this phase ramp, $b_{CAIPI}$, can be incremented by $\pi$ radians in consecutive repetitions. The fully sampled region in the center of k-space from consecutive repetitions can then be added and subtracted to obtain reference data for each slice. As an example, Hadamard encoding can be used to separate the k-space data acquired for the parallel slices on each orthogonal axis.

When the pair of slices in each orthogonal slice packet are excited in quadrature, the reference data for each slice separated from Hadamard encoding can be used to compute phase-constrained 2D-SENSE-GRAPPA weights to separate the aliased slices from a single repetition. For instance, virtual coil reference images can be created by taking the complex conjugate of the images from only the fully-sampled region of the Hadamard separated k-spaces for each orthogonal slice group. The virtual coil reference images are appended to the actual coil images.

The reference images are concatenated along the readout direction, brought to k-space, and a 2D-SENSE-GRAPPA kernel (e.g., a 4×4 2D-SENSE-GRAPPA kernel) is fit to simultaneously unalias a single repetition in the slice and in-plane directions. In the example kernel geometry shown in FIG. 5, closed black circles are source points, the grayed out points are target points, and the open circles represent unacquired points.

The resulting weights can be applied to the aliased data from a single repetition (actual and virtual coils), filling in missing points in the undersampled phase and frequency encoding directions. To account for partial Fourier sampling, the phase encoding lines still missing after 2D-SENSE-GRAPPA in the actual coils can be filled in by enforcing conjugate symmetry in k-space after a background phase correction. An inverse Fourier transform and sum of squares coil combination can then be used to produce an unaliased image. The individual slices were obtained by segmenting the readout-extended FOV image. This process is repeated to separate slices S3 and S4.

In the non-limiting example described above, a SIR readout can be used to separate the orthogonal slice packets, and an autocalibrating phase-constrained 2D-SENSE-GRAPPA reconstruction can be used to separate the overlapped parallel slices along each axis. The mSOPI sequence enables improving slice coverage while keeping the frame rate as high as it is for non-multiplexed SOPI. The partial Fourier acquisition can allow for a larger fully sampled ACS region near the center of k-space to be sampled for a given frame rate.

The SOPI pulse sequences described above implement a T1-weighted contrast with an SPGR acquisition. In other embodiments, however, pulse sequences that acquire data with contrast weightings different than T1-weighting can also be acquired using SOPI, at least in part. As one example, a balanced steady state free precession ("bSSFP") sequence with mixed T2/T1 can be implemented.

When an object is moving during data acquisition there will be spatiotemporal correlations in the acquired k-space data. These correlations can be exploited using k-t GRAPPA to interpolate the undersampled k-t space of alternating, orthogonal slice non-T1-weighted acquisitions. In k-t GRAPPA, the signal for a coil, j, and time point, t, can be described as a linear combination of signals from $N_k$ neighboring k-space locations, $N_t$ neighboring time frames, and all $N_c$ receiver coils:

$$S_j(k,t) = \sum_{i_c=1}^{N_c} \sum_{i_k=1}^{N_k} \sum_{i_t=1}^{N_t} S_{i_c}[k(i_k), t(i_t)] \cdot n_j^{i_c, i_k, i_t}; \quad (13)$$

Because the k-t correlations are independent of image contrast, the k-t GRAPPA weights may be calculated from fully-sampled T1-weighted SOPI data and applied to the undersampled non-T1-weighted images. Furthermore, even when a Cartesian SOPI calibration acquisition is employed, the alternating non-T1-weighted scan may be performed with an arbitrary k-space trajectory.

Figure 6:
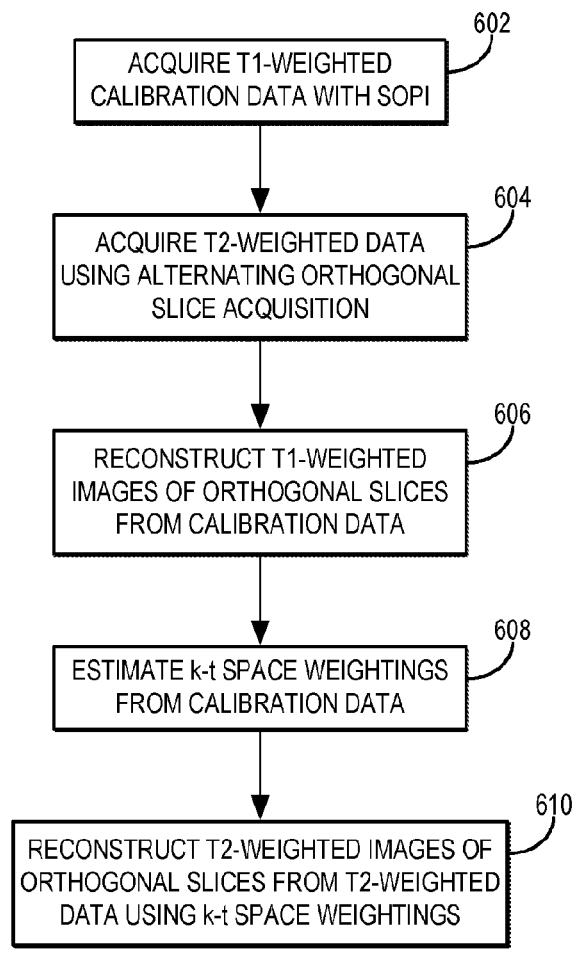
FIG. 6 is a flowchart setting forth the steps of an example method for acquiring and reconstructing T2-weighted images depicting orthogonal slices using a T1-weighted SOPI acquisition as calibration data.

Referring now to FIG. 6, a flowchart is illustrated as setting forth the steps of an example method for producing images with contrast weighting other than T1-weighting in orthogonal slices acquired in a single acquisition. The method includes acquiring calibration data from a subject using a SOPI pulse sequence, as indicated at step 602. These calibration data are acquired with a T1-weighting. Preferably, the calibration data fully samples k-space; however, in some implementations the calibration data may sample only the central portion of k-space.

Figure 7:
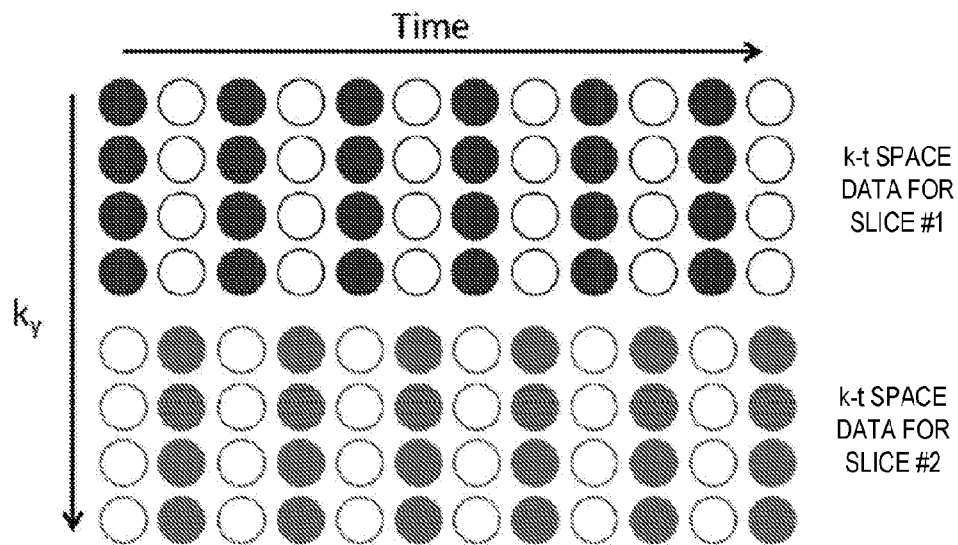
FIG. 7 illustrates an undersampled k-t space resulting from alternating data acquisitions between orthogonal slices.

Non-T1-weighted data are then acquired from the subject in the same orthogonal slices as were sampled with the calibration data, as indicated at step 604. Unlike the calibration data, the non-T1-weighted data are acquired from orthogonal slices by alternating data acquisition between the two orthogonal imaging planes rather than simultaneously acquiring the data using a SOPI acquisition scheme. By rapidly acquiring data from these orthogonal slices in an alternating fashion, the data can be represented as an undersampled k-t space, as shown in FIG. 7. As one example, the non-T1-weighted data can be acquired using a bSSFP pulse sequence. The non-T1-weighted images can be acquired using a Cartesian sampling of k-space, or can use any arbitrary k-space trajectory (e.g., radial, spiral). That is, the calibration data and the non-T1-weighted data do not need to be acquired using the same k-space trajectories. As one example, a radial CAIPIRINHA acquisition can be used. In such an acquisition, slices along each axis can be separated by modulating the phase of the radial data by the complex conjugate of the applied RF phase pattern.

Figure 8:
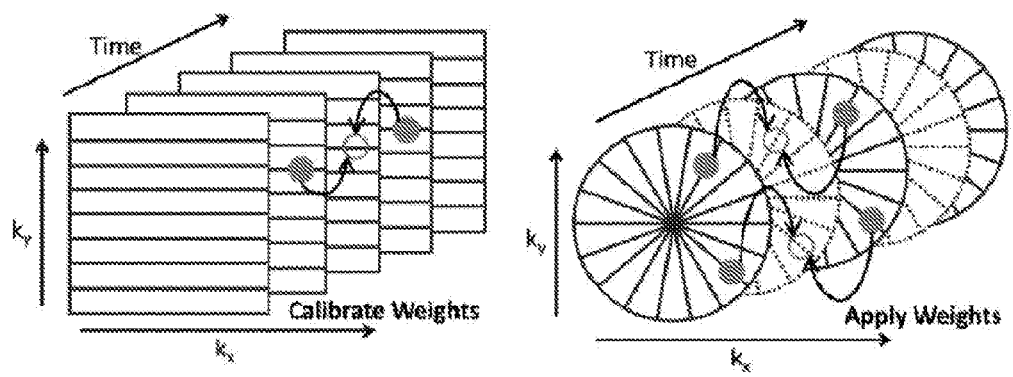
FIG. 8 illustrates the calibration of k-t weightings from SOPI calibration data and the application of those weightings for the reconstruction of undersampled k-t space data.

From the calibration data, T1-weighted images depicting the orthogonal slices can be reconstructed, as indicated at step 606. The calibration data are also processed to estimate k-t space weightings, as indicated at step 608. For example, a k-t GRAPPA algorithm can be calibrated on the calibration data with a kernel. As one non-limiting example, the kernel size can be 3 time points by 16 coils. The estimated k-t space weightings can then be used to reconstruct T2-weighted images of the orthogonal slices from the T2-weighted data, as indicated at step 610. For instance, the k-t space weightings can be used in a k-t GRAPPA reconstruction algorithm. Using this approach, the resulting T2-weighted images will represent a time series of image frames depicting the orthogonal slices with a higher temporal frame rate than would be achieved without estimating the k-t space weighting from the calibration data. The calibration and reconstruction steps are schematically shown in FIG. 8. The images of the orthogonal slices can be used to monitor subject motion, such as respiratory motion. For example, a projection through each slice can be plotted over time to resolve respiratory motion.

The continuously adapting treatment cycle afforded by MR-guided radiation therapy ("MR-gRT") systems allows radiation treatment replanning with every measurement of anatomy. Advantageously, the replanning could be done in real-time during a treatment fraction. Alternatively, the replanning may also be done between fractions.

If a full 3D volume of the anatomy is known at every point during a treatment fraction, then the dose that was actually deposited in that fraction can be calculated, accumulated, and used to adaptively replan the next fraction. The 3D volumetric estimates should be obtained at a very high temporal resolution.

One proposed solution for estimating 3D motion in real-time is by using deformable registration of real-time 2D interleaved orthogonal images to phases of a 4D MRI. PCA-based motion models are built and updated during the real-time acquisition. While results from this technique are promising, a lower latency motion estimate and a smaller dependence on deformable image registration ("DIR") would be useful because the accuracy of DIR algorithms may be unreliable in the abdomen.

Low latency motion surrogate signals are utilized in respiratory gated treatments and in prediction algorithms for tracked treatments. Because cine images are often acquired during treatment of abdominal or thoracic tumors that move with respiration, it would be beneficial to obtain the motion surrogate directly from the imaging data already being acquired. Respiratory bellows can be cumbersome, inconsistent, and are not always correlated with anatomical motion.

In radial CAIPIRINHA scans, the motion surrogate may be obtained directly from the center of k-space, which is sampled in every spoke at a temporal resolution of 1/TR. In Cartesian acquisitions, the center of k-space is only sampled once per frame of each image, so obtaining a DC navigator from SOPI scans with Cartesian k-space sampling is not as straight forward as in radial CAIPIRINHA scans.

The phase encoding sampling scheme used in a Cartesian SOPI acquisition can, however, be selected such that lines near the center of k-space are sampled frequently, so as to allow for the generation of a motion surrogate signal. By performing a Fourier transform of each phase encoding line within a threshold of the center of k-space, a pseudo-projection can be calculated. After some filtering, the pseudo-projection waveform over time can be used as a motion surrogate signal. This technique is especially applicable in GRAPPA acquisitions because the center of k-space is more densely sampled than outer regions of k-space.

Described now are methods for implementing synthetic volume imaging ("SVI"). SVI relates a low-latency motion surrogate signal (which may be derived from SOPI, radial CAIPIRINHA, or other techniques) and an average respiratory waveform (which may be derived from a pre-treatment 4D-MRI) to create volumetric images of the anatomy at the temporal resolution of the motion surrogate signal. These two signals can be related using, for example, a correlation, root-mean-square, or regression technique. Fast volumetric images are needed to accumulate dose during a radiotherapy treatment fraction. By using SVI to decrease the latency of the volumetric images, a more accurate estimate of deposited dose may be computed. SVI offers the following advantages: there is no dependence on deformable image registration algorithms to generate motion models relating real-time imaging to the true 3D volumes, volumetric images are synthesized at the temporal resolution (e.g., 50-300 Hz) of a motion surrogate signal derived from 2D MR imaging data, quality assurance of SVI may easily be performed with registration of SVI to real-time 2D images, and exception gating/tracking can be performed based on 3D target segmentation.

Figure 9:
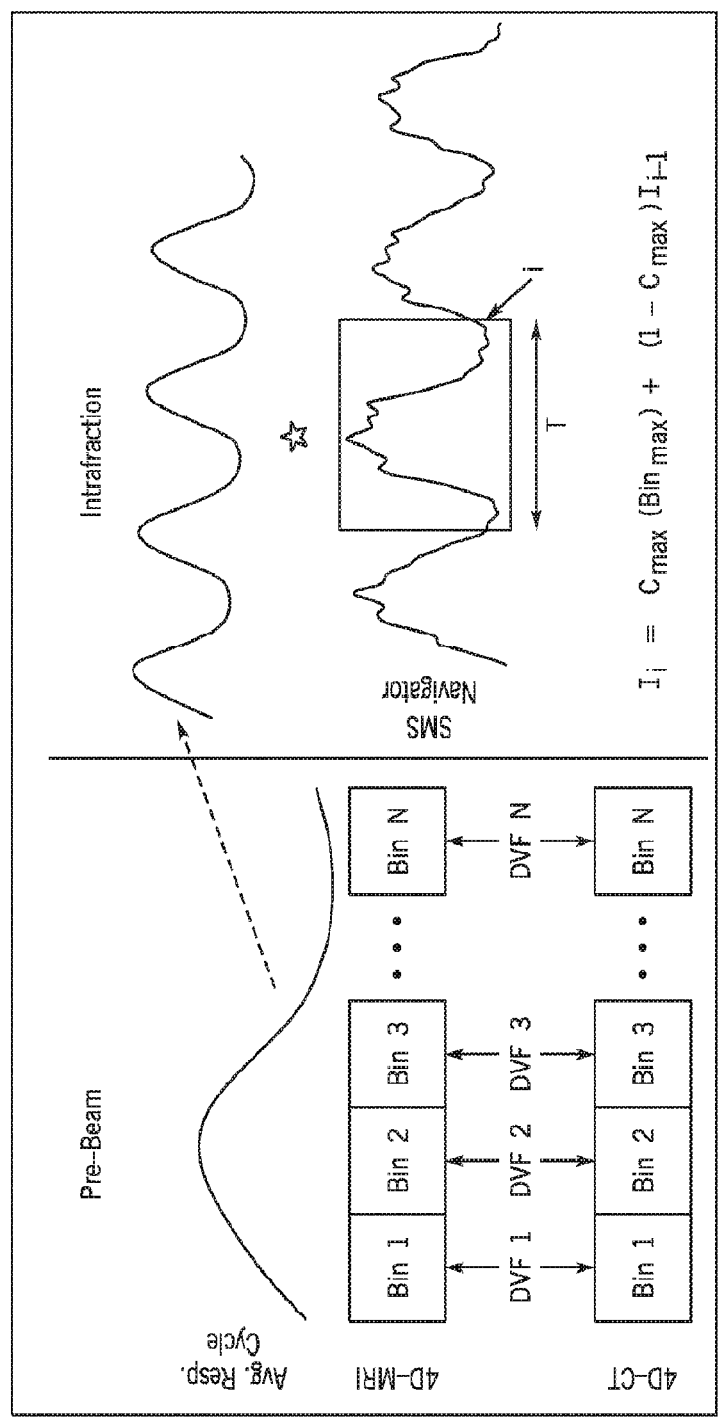
FIG. 9 illustrates an example workflow for a synthetic volume imaging ("SVI") processing method.

The SVI techniques described in the present disclosure synthesize extremely low latency 3D volumes based on correlations of a real-time motion surrogate (derived, for example, directly from radial CAIPIRINHA or SOPI imaging) and based on an average respiratory waveform computed during reconstruction of a respiratory correlated 4D MRI. The SVI algorithm is shown graphically in FIG. 9. SVI begins with the acquisition of a 4D-MRI. A motion surrogate signal inherent to the 4D-MRI acquisition is used to retrospectively bin the raw k-space data into appropriate respiratory phases. The average respiratory waveform is obtained by interpolating the average motion surrogate signal value over all bins to the temporal resolution of the real-time navigator acquired while the beam is on. To reconstruct a 3D volume at the $i^{th}$ time point in the real-time navigator waveform, a signal history length ("T") of the navigator is cross-correlated with the average respiratory waveform from each bin. The result is a correlation coefficient showing how well the current signal relates to each respiratory bin, $$I_i = C_{max} \text{Bin}_{max} + (1 - C_{max}) I_{i-1} \quad (14).$$

The maximum correlation value, $C_{max}$, and the corresponding 3D volume from the best-correlated bin, $\text{Bin}_{max}$, are used to construct a weighted volume. A correction term is added to weight the synthetic volume more on the previous estimate if the maximum correlation was poor. Kalman filtering may also be applied to predict future values of the 1D surrogate signal, which may in turn be used to generate predictive SVI images.

As one example, a self-navigated hybrid radial/Cartesian bSSFP 4D-MRI acquisition was used to acquire images of a subject. Ten respiratory bins were retrospectively reconstructed and the average respiratory waveform was computed. The center of k-space signal from an axial three-band bSSFP radial CAIPI cine scan (TE/TR=1.7/3.4 ms, flip angle=60°, FOV=300 mm, base resolution=128×128) was used to generate a motion surrogate signal. The temporal resolution of the motion surrogate signal was 1/TR=294 Hz. At each time point in the real-time navigator signal, the most recent 5 seconds of data were analyzed. The current respiratory rate was determined by fitting a sinusoidal function to the current segment of the surrogate signal. The average respiratory waveform from the 4D-MRI scan was set to have a respiratory rate that was computed from the surrogate signal. The average respiratory waveform was then low-pass interpolated to the temporal resolution of the radial CAIPI navigator and made to be periodic. An average respiratory waveform of length 5 seconds was generated for each bin of the 4D MRI. All of these signals were then cross-correlated with the radial CAIPI navigator signal. The synthetic volume for the current time point was then calculated using Eqn. (14).

In some implementations of the methods described in the present disclosure, self-navigated phase-resolved 4D MRI images can be acquired using a hybrid 3D radial k-space trajectory, and in some examples a 3D radial stack-of-starts trajectory. For example, a self-navigated, phase-resolved 4D-MRI method that provides a full 3D volume of anatomy at multiple phases of an average respiratory cycle can be implemented. This technique uses the self-navigating properties of radial k-space trajectories to guide the reconstruction of phase-resolved 4D-MR images. Images may be acquired using a hybrid 3D radial sequence with switchable SPGR and bSSFP excitations (e.g., T1 or mixed T2/T1 contrast modes). The sequence may use Cartesian sampling with volumetric interpolation along the partition direction and in-plane golden angle radial sampling or 3D golden angle radial sampling.

Figure 10:
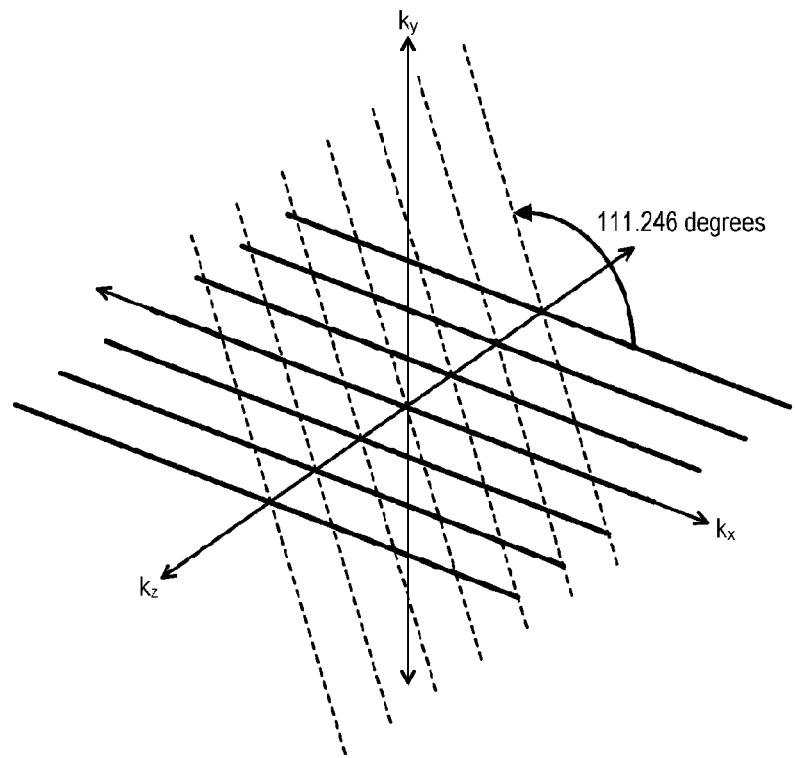
FIG. 10 shows a hybrid 3D golden angle radial stack of stars k-space trajectory.

An example of a hybrid, slab-selective, 3D radial pulse sequence that can be implemented for 4D-MRI includes switchable gradient and RF spoiled, balanced steady-state free precession, Dixon, and reversed fast imaging in steady-state precession (reversed FISP or PSIF) modes, which can produce T1 contrast, mixed T2/T2 contrast, and T2 contrast. Cartesian encoding of all partitions is performed linearly, along the $k_z$ direction for a given spoke angle, generating a spoke-plane. After acquisition of all partitions within the spoke-plane, the spoke angle is incremented by the golden angle (pi*golden ratio=111.245 degrees) and another spoke-plane is acquired, as shown in FIG. 10. In this hybrid 3D golden angle radial stack of stars trajectory, all partitions defining a spoke-plane are acquired before incrementing the spoke angle. This process is repeated for the entire scan duration.

To extract a self-navigation signal, a spectrum along the axis of rotation (kx=ky=0) of each spoke-plane can be extracted for each receive coil and can be zero padded along $k_z$. A 1D FFT can then be performed to generate a projection. The maximum spatial shift between the $i^{th}$ projection and a reference projection can be determined using cross-correlation or center of mass and plotted as a function of time. A bandpass filter (e.g., a filter with a passband of 0.1-0.5 Hz) can be applied to each of the coil waveforms. The filtered waveforms from each coil can then combined into a single waveform using principal component analysis or other suitable processing techniques. The combined waveform mimics the signal generated from a respiratory bellows.

The peaks of each respiratory phase in the navigator waveform, corresponding to end inspiration, can be auto-detected. A patient-specific non-parametric confidence interval can then be determined and applied as a data integrity constraint. Data from peaks falling outside the confidence interval (e.g., shallow or deep breaths) can then be skipped in the reconstruction.

The respiratory cycles, or only those respiratory cycles surviving the data-integrity constraints, are decimated into phase bins. As one example, ten phase bins can be used. A lookup table (LUT) can be generated relating spoke angle to bin number for all spoke angles in the acquisition. The LUT can then be applied to reshuffle the k-space trajectory, density compensation factors, and data to fill a hybrid 3D+time k-space containing of the number of phase bins.

Figure 11:
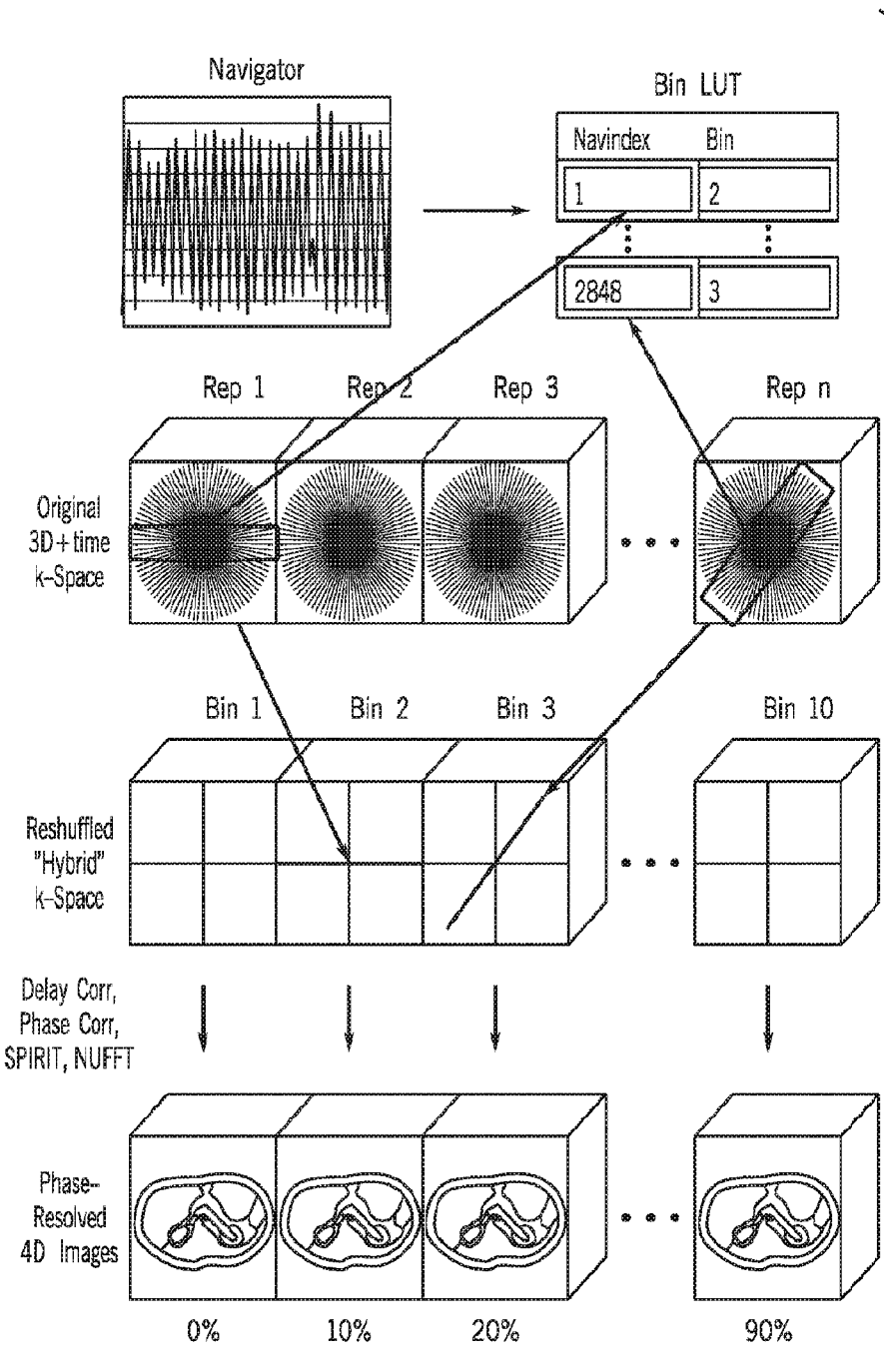
FIG. 11 illustrates an example workflow for a self-navigated phase-resolved 4D-MRI reconstruction.

An example phase-resolved 4D-MRI reconstruction is shown schematically in FIG. 11. A motion surrogate signal extracted from a projection along the slab-select direction is used to reshuffle the data into its appropriate respiratory phase. Irregular breaths (i.e., those breaths that lie outside of a 95% confidence interval) are excluded from reconstruction. The reshuffled k-space data is brought into a hybrid space ($k_x$, $k_y$, z). The data and k-space trajectory for each phase are passed into either the NUFFT, CG-SENSE, XD-GRASP, or SPIRiT reconstruction algorithms, which return a full 3D volume at each respiratory phase.

Correction for gradient and receive chain group delays can be performed using an iterative approach. After the reshuffling, phase correction (similar to EPI reference correction) can also be performed to further align all projections within a respiratory bin. Volumetric interpolation is performed along the $k_z$ direction followed by a 1D FFT along $k_z$. Correction for k-space sparsity can be implemented, such as by using the SPIRiT algorithm with NUFFTs applied along the $k_x$-$k_y$ dimensions. Reconstructed 3D volumes for each bin can be output as DICOM images, reloaded back to the scanner, and corrected for gradient nonlinearities using a vendor-provided 3D distortion correction algorithm.

Figure 12:
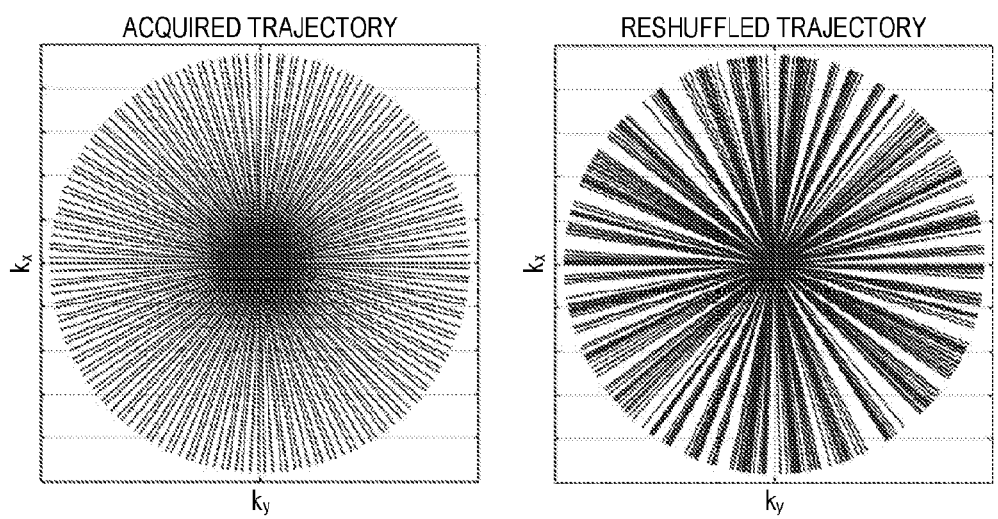
FIG. 12 depicts the effect of reshuffling on k-space distribution. Reshuffling results in more spokes per bin.

The method described above implements a reshuffling of k-space data. FIG. 12 illustrates an example of acquired and reshuffled radial k-space trajectories for one respiratory phase bin of one patient. Radial k-space rasters ensure the center of k-space is covered with each spoke, preventing shading artifacts that would be apparent in reshuffled Cartesian acquisitions. Compared to the acquired trajectory, in which 89 spokes are quasi-uniformly distributed in k-space, the reshuffled trajectory for one respiratory phase bin contains a larger number of spokes (209 in this example), but exhibits regions of k-space sparsity. One benefit of the golden angle radial rasters is that all spokes meeting the integrity constraints described above can be used without needing to handle data averaging of overlapping spokes.

This method utilizes the self-navigating properties of radial k-space trajectories to generate phase-resolved 4D-MR images. The change in intensity that produces the self-navigating signal arises from a change in total signal power in the excited volume during respiration. The method described here eliminates the need for external respiratory surrogates (e.g., bellows, reflector camera, body surface area), improves image contrast, and reduces sorting errors compared to 4D-CT, which in turn eliminates imaging radiation dose. The spin system steady state is maintained by consecutively exciting the same slab with each shot, and increased efficiency is obtained by eliminating the need to interlace 1D pencil beam or 2D image navigators. Overall clinical efficiency improves with the method described here because iterative fine tuning of a respiratory bellows position is eliminated, signal saturation and gain resetting is avoided, and reshuffling is performed in reconstruction rather than as a separate post-processing procedure (e.g., as is done in conventional 4D-CT).

The method described here also utilizes volumetric interpolation along the $k_z$ direction. By undersampling along the partition direction, the sampling rate of the navigator can be increased. In addition, using Cartesian encoding along $k_z$ eliminates the need for 3D gridding or NUFFT algorithms, permitting parallelized reconstruction, and thereby decreasing image reconstruction times.

In addition to self-navigating properties, radial trajectories offer a number of advantages including acquisition of reduced FOV images without aliasing, motion resilience, and relatively benign undersampling artifacts. Furthermore, using golden angle stepping through radial angles reduces eddy currents compared to linear stepping radial trajectories.

Interrogation of the combined navigator waveform derived as described above, and its FFT, can be used to assess whether a given patient would be a good candidate for respiratory-gated treatment delivery. If so, the 4D-MR images can be used to construct gated planning target volumes from a sub-selection of respiratory phases for gated treatment deliveries. If not, a mid-position image can be derived that provides a time-averaged anatomy for non-gated radiation delivery. Similar to the mid-position image derived from 4D-CT, the mid-position 4D-MR image demonstrates reduced image artifacts (e.g., streaking). Motion models can be used to transfer respiratory triggered/gated and breath-hold MR images (acquired at potentially different points in the respiratory cycle) to the mid-position image for target and OAR delineation.

Through the use of deformable image registration, 4D-MRI can serve as a vehicle to transform images acquired in a position favorable for motion management (e.g., end inspiratory breath holds) to a position more favorable for treatment delivery (e.g., end expiration for gating).

The optimal image contrast and timing of the 4D-MRI may be disease specific. The method described above provides switchable T1, mixed T2/T1, and T2 contrasts, which permits tailoring of the 4D-MRI acquisition to best visualize a particular tumor or critical structure. Furthermore, for tumors and tissue with slow kinetics (e.g., washout), target visualization may be improved by adjusting the position of 4D-MRI acquisition within the MRI simulation protocol. For example, visualization of hepatocellular carcinoma (HCC) and esophageal cancer may benefit from T2 contrast obtained by acquiring 4D-MRI images in bSSFP or PSIF modes. However, visualization of cholangiocarcinoma and liver metastasis may benefit from T1 contrast obtained by acquiring 4D-MR images in SPGR mode at a delay following contrast administration. Visualization of lung tumors may benefit from SPGR mode to eliminate banding artifacts present in bSSFP mode in regions of high magnetic susceptibility. Because the center of k-Space is acquired with each spoke, radial rasters results in an "averaged" post-contrast image as contrast washes in and out.

Figure 13A:
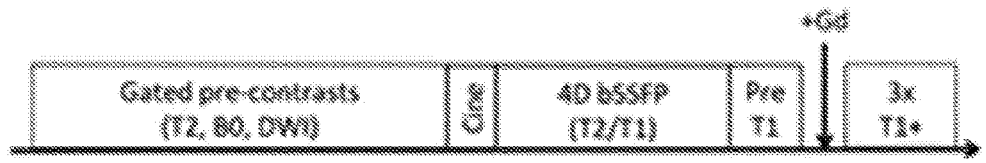
FIGS. 13A-13D show example 4D-MRI acquisition strategies utilizing different contrast modes and timings.
Figure 13B:
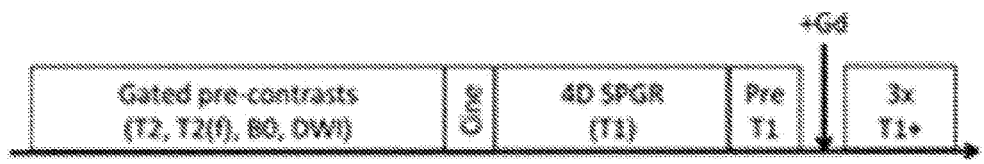
Figure 13C:
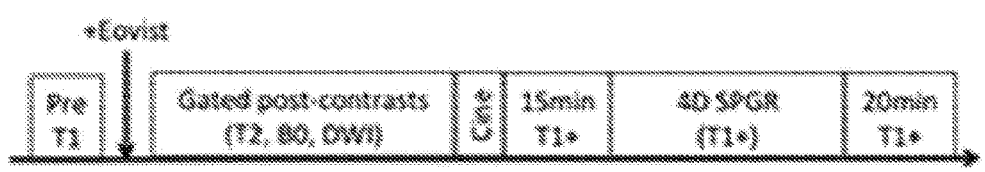
Figure 13D:
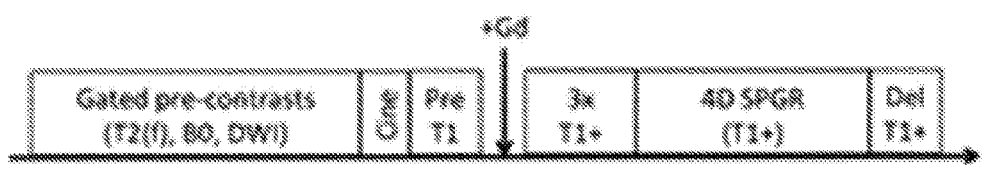

Examples of different 4D-MRI acquisition strategies utilizing alternative contrast modes and timings are shown in FIGS. 13A-13D. Hepatocellular carcinoma and esophageal cancer benefit from increased T2 weighting (FIG. 13A). Pancreatic cancer benefits from T1 weighted imaging (FIG. 13B). Cholangiocarinoma benefits from post-Eovist T1 weighted imaging (FIG. 13C). Liver metastases benefits from post-contrast T1 imaging (FIG. 13D).

The auto-alignment of 2D cine imaging planes can be used to verify 4D-MRI motion estimates during 4D-MRI commissioning or MRI simulation. In addition, the feature could be implemented to align cine images for real-time motion management on MRI-gRT systems following a daily pre-beam 4D-MRI scan to assess anatomy and motion variation of the day.

The methods described here utilize a constrained phase-based sorting technique to reshuffle the k-space data. This approach excludes outlying shallow or deep breaths from confounding motion models derived from 4D-MRI. The result of this operation is a mean respiratory motion model. Alternatively, conventional phase-based or amplitude-based sorting methods could also be used.

Though a retrospective approach to reconstruct 4D-MRI images is described above, the method could be extended to prospective acquisitions. For instance, the method could be extended to prospective acquisitions with near real-time feedback of the navigating waveform so the user can assess the reliability of the patient breathing.

Figures 14A, 14B:
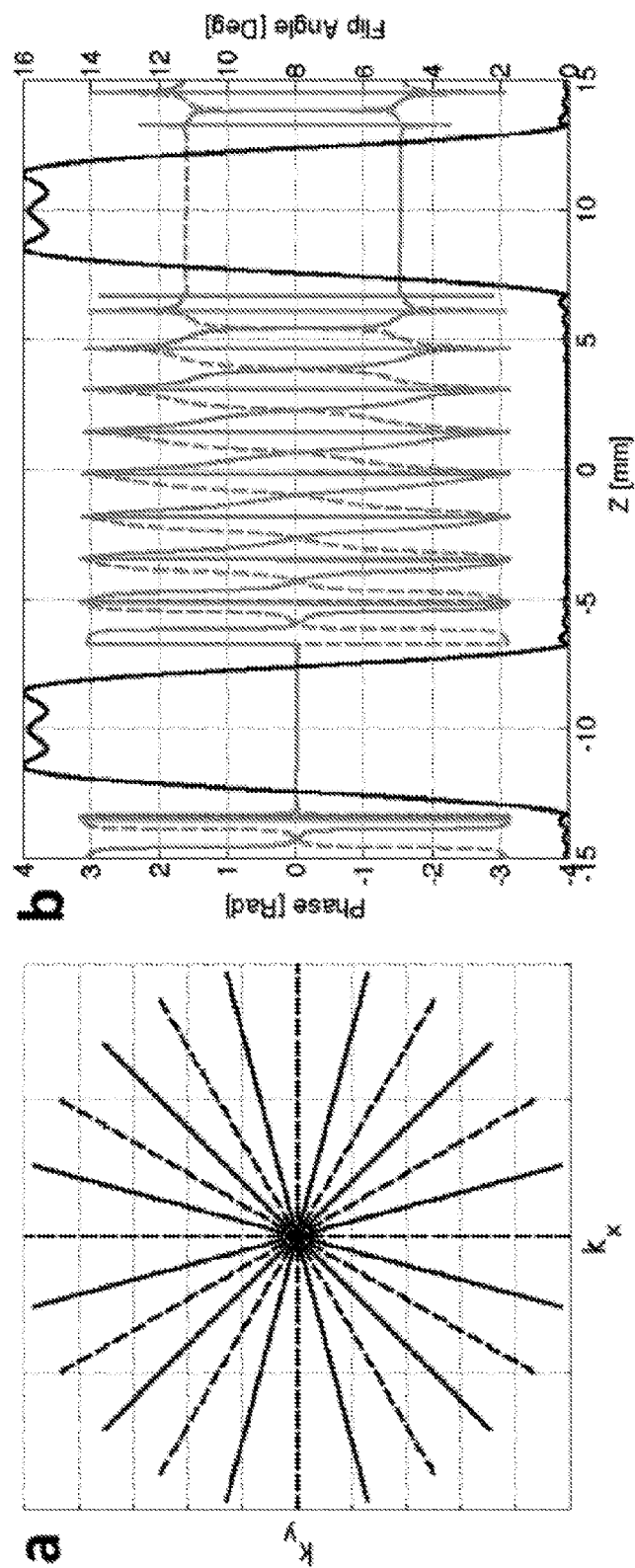
FIG. 14A illustrates an example of a radial k-space trajectory that can be implemented for a radial CAIPIRINHA acquisition.
FIG. 14B shows example magnitude and phase profiles for multiband RF pulses used to acquire data according to the radial k-space trajectory of FIG. 14A.

In some implementations of the methods described in the present disclosure, radial CAIPIRINHA acquisitions can be implemented. Radial CAIPIRINHA acquires multiple 2D slices concurrently and separates the aliased slices during image reconstruction. This technique utilizes phase-controlled radio frequency pulses along with a radial k-space trajectory. An example of a radial k-space trajectory that can be used with radial CAIPIRINHA acquisitions is shown in FIG. 14A, in which alternating phase cycling for two-band simultaneous multislice imaging is implemented. The solid lines in FIG. 14A indicate k-space lines acquired with a first phase and the dashed lines in FIG. 14A indicate k-space lines acquired with a second phase that is different from the first phase. FIG. 14B illustrates simulated two-band slice profiles with flip angle shown in black (right axis) and magnetization phase shown in gray (left axis). The dashed and solid gray lines in FIG. 14B show the phase for the dashed and solid spokes in FIG. 14A, respectively. Note that the phase stays constant on the left slice while there is a phase difference of n between alternating spokes on the right slice.

The radial CAIPIRINHA acquisition permits rapid separation of aliased slices in reconstruction and provides an extremely low latency motion signal from the center of each radial spoke to guide tracking algorithms. The acceleration along the slice select direction can be combined with in-plane acceleration through radial undersampling to achieve effective frame rates approaching 10 frames/sec.

Accurate control of the phase of each simultaneously excited slice is essential to any CAIPIRINHA acquisition.

To meet this specification, Shinnar-Le Roux (SLR) RF pulses can be implemented. The process of designing RF pulses for radial CAIPIRINHA applications can begin with an RF pulse for a single slice. A copy of the polynomial coefficients for this RF pulse can be made for each intended SMS slice location. The phase of each set of coefficients can be modulated to account for slice location, RF pulse duration, the isocenter delay, and the desired phase tag. The phase-modulated coefficients from each slice can then be added together and an inverse SLR transform can be applied to map them back to a multiband RF pulse.

Images can be reconstructed from data acquired using a radial CAIPIRINHA acquisition as follows. The radial data can first be corrected for timing offsets to avoid signal roll-off near the edges of the images. This correction can be iteratively implemented by computing the linear phase ramp in the projection domain that produced the maximum image intensity. A ramp filter (e.g., a Ram-Lak filter) can be used as a density compensation function for the radial data. The image of the slice that saw a constant phase of zero radians over every spoke can be obtained using a non-uniform fast Fourier transform (NUFFT). To reconstruct the image of the other slices, the conjugate of the phase that was applied with the RF pulse is first added to each spoke. For example, to reconstruct the right slice in FIG. 14B, dashed spokes in FIG. 14A were multiplied by $e^{-i\pi/2}$ and solid spokes were multiplied by $e^{+i\pi/2}$. The NUFFT was then used to reconstruct the phase-cycled slice.

In some implementations, a continuous golden angle acquisition can be used. In these instances, a sliding window reconstruction can be chosen such that all slices in each cine frame were reconstructed with a selected number of k-space spokes, such as 144 spokes. Half of the k-space can thus be shared between neighboring temporal frames.

Because the radial k-space trajectories used in a radial CAIPIRINHA acquisition sample the center of k-space with each spoke, the k-space center signal from two simultaneously excited slices can be used as a motion surrogate, such as for synthetic volume imaging applications described in the present disclosure.

Radial k-space trajectories are advantageous for real-time imaging of a subject in the presence of respiratory motion because of their robustness to intra-slice motion, reduced undersampling artifact, and inherent navigator. As an advantage of radial CAIPIRINHA over Cartesian CAIPI, parallel imaging algorithms are not required to obtain an initial image of each of the simultaneously excited slices acquired using radial CAIPIRINHA.

There are also advantages of radial over Cartesian trajectories for cine MRI. Sampling of the DC signal with every spoke gives radial trajectories a very large tolerance against motion artifacts, even in fast moving structures like the heart. Because undersampling radial trajectories produces aliasing in the form of streaking rather than signal wraparound, undersampled radial images are still usable. Therefore, radially sampled k-space can be undersampled and images reconstructed without using parallel image reconstruction techniques without greatly impacting image quality. Reducing latency by avoiding time-expensive reconstruction algorithms is a benefit of radial imaging. In addition, reduced field-of-view images may be obtained by increasing the receiver bandwidth along each spoke.

The magnitude of the center k-space point from every spoke also acts as an inherent navigator signal, mitigating the need to use a respiratory bellows for surrogate information. Choosing an MRI pulse sequence that contains an inherent navigator eliminates the need for a surrogate signal like a respiratory bellows. The 2D navigator may be correlated with an interpolated average navigator from a 4D MRI acquisition to obtain low latency estimates of anatomical location and motion. Real-time segmentation of the cine images and their registration to a 3D reference volume can further improve and help predict target and organ-at-risk location.

Minimizing latency in the acquisition, reconstruction, and segmentation chain is important for accurate target tracking in MRI-guided radiotherapy. Radial CAIPIRINHA and the other techniques described in the present disclosure provide for the acquisition of extremely low latency motion information (e.g., updated every TR) with higher latency images sampled at multiple spatial locations. The low latency motion estimation can be used to drive motion prediction algorithms based on 4D-MRI data, with verification of anatomy position using the higher latency, segmented radial CAIPIRINHA images.

Figure 15:
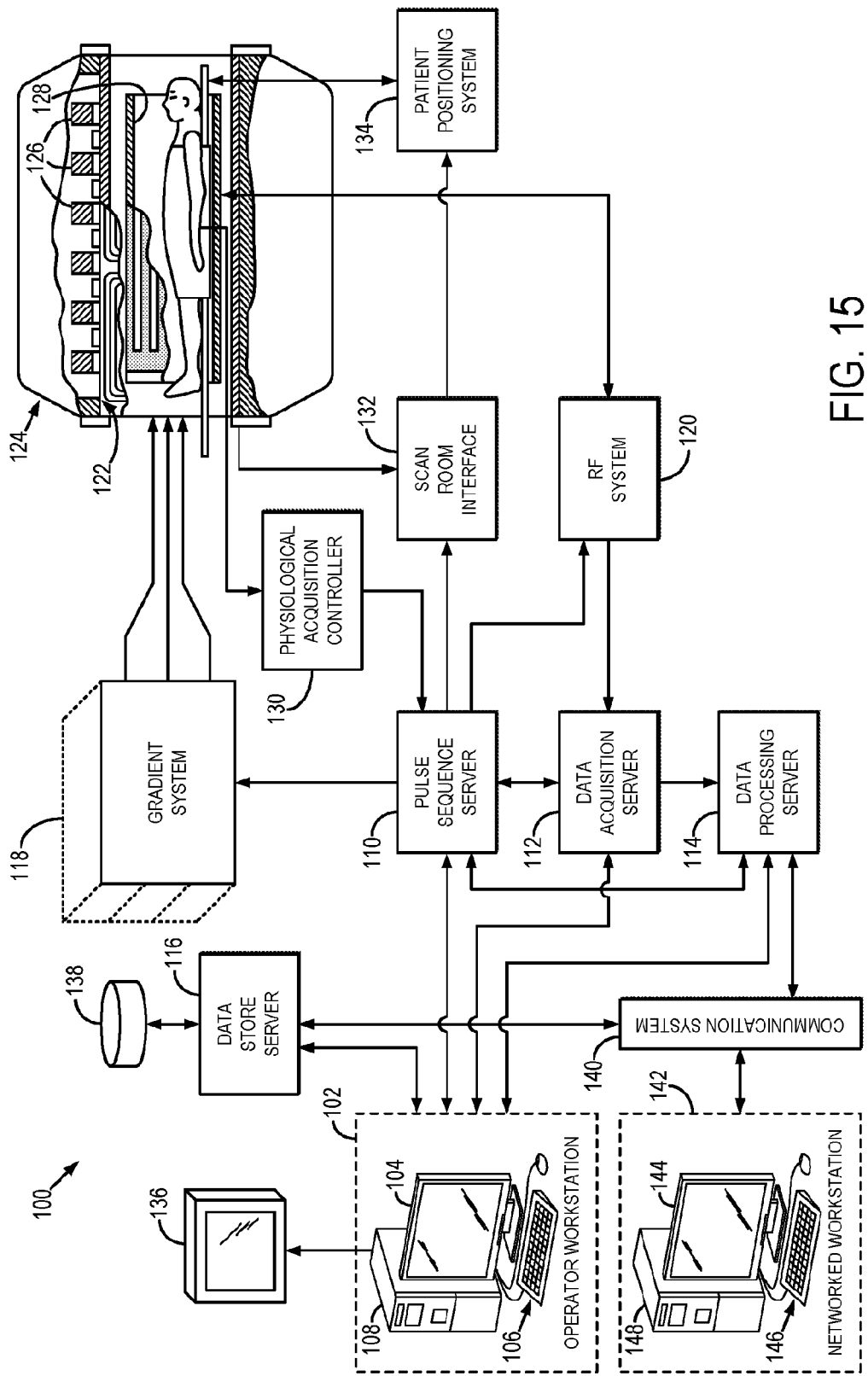
FIG. 15 is a block diagram of an example magnetic resonance imaging ("MRI") system that can implement the methods described in the present disclosure.

Referring particularly now to FIG. 15, an example of an MRI system 100 that can implement the methods described here is illustrated. In some configurations, the MRI system can incorporate a radiation treatment system, with such systems being referred to as MRI-guided radiation therapy ("MR-gRT") systems.

The MRI system 100 includes an operator workstation 102 that may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{15};$$

and the phase of the received magnetic resonance signal may also be determined according to the following relationship:

$$\varphi = \tan^{-1}\left(\frac{Q}{I}\right). \tag{16}$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

The present disclosure has described one or more preferred embodiments, and it should be appreciated that many equivalents, alternatives, variations, and modifications, aside from those expressly stated, are possible and within the scope of the invention.

The invention claimed is:

1. A method for acquiring magnetic resonance data using a magnetic resonance imaging (MRI) system, the steps of the method comprising:
   (a) performing a pulse sequence with the MRI system, wherein the pulse sequence includes:
      a first radio frequency (RF) excitation pulse that excites spins in a first slice;
      a first slice encoding gradient produced along a first axis and contemporaneous with the first RF excitation pulse to provide slice encoding of the spins in the first slice;
      a second RF excitation pulse that excites spins in a second slice that is orthogonal to the first slice;
      a second slice encoding gradient produced along a second axis that is orthogonal to the first axis and contemporaneous with the second RF excitation pulse to provide slice encoding of the spins in the second slice;
      a first phase encoding gradient produced along the first axis to provide phase encoding of spins in the second slice;
      a second phase encoding gradient produced along the second axis to provide phase encoding of spins in the first slice;

a frequency encoding gradient produced along a third axis that is orthogonal to the first axis and the second axis, and that forms a first echo signal at a first echo time and a second echo signal at a second echo time, wherein the first echo signal is associated with spins in the first slice and the second echo signal is associated with spins in the second slice;

(b) acquiring first data from the first echo signal with the MRI system, the first data being associated with the first slice;

(c) acquiring second data from the second echo signal with the MRI system, the second data being associated with the second slice; and wherein:
the first RF excitation pulse is a multiband RF pulse that simultaneously excites spins in a plurality of parallel first slices that are each orthogonal to the second slice;
the first slice encoding gradient provides slice encoding of the spins in the plurality of parallel first slices;
the second phase encoding gradient provides phase encoding of the spins in the plurality of parallel first slices; and
the first data is associated with the plurality of parallel first slices.

2. The method as recited in claim 1, wherein the first echo occurs before the second echo.

3. The method as recited in claim 1, wherein the first echo occurs after the second echo.

4. The method as recited in claim 1, wherein the first echo time and the second echo time are equal.

5. The method as recited in claim 1, wherein the first echo time and the second echo time are not equal.

6. The method as recited in claim 1, wherein:
the second RF excitation pulse is a multiband RF pulse that simultaneously excites spins in a plurality of parallel second slices that are each orthogonal to the plurality of parallel first slices;
the second slice encoding gradient provides slice encoding of the spins in the plurality of parallel second slices;
the first phase encoding gradient provides phase encoding of the spins in the plurality of parallel second slices; and
the second data is associated with the plurality of parallel second slices.

7. The method as recited in claim 6 further comprising reconstructing a plurality of first images from the first data and a plurality of second images from the second data, wherein each of the plurality of first images depict a different one of the plurality of parallel first slices and each of the plurality of second images depict a different one of the plurality of parallel second slices.

8. The method as recited in claim 1, further comprising reconstructing a plurality of first images from the first data and a second image from the second data, wherein each of the plurality of first images depict a different one of the plurality of parallel first slices and the second image depicts the second slice.

9. The method as recited in claim 8, wherein reconstructing the plurality of first images from the first data includes forming reference data from the first data and using the reference data to estimate a reconstruction kernel to reconstruct the plurality of first images, wherein the reference data are formed by selectively combining k-space data that samples a center region of k-space from consecutive repetition time periods.

10. The method as recited in claim 9, wherein selectively combining the k-space data that samples the center region of k-space from consecutive repetition time periods includes adding and subtracting the k-space data using Hadamard encoding.

11. The method as recited in claim 1, further comprising reconstructing a first image from the first data and a second image from the second data, wherein the first image depicts the first slice and the second image depicts the second slice.

12. The method as recited in claim 1, wherein the pulse sequence further comprises:
a third RF excitation pulse that excites spins in a third slice that is orthogonal to the first slice and the second slice;
a third slice encoding gradient produced along the third axis and contemporaneous with the third RF excitation pulse to provide slice encoding of the spins in the third slice;
a third phase encoding gradient produced along the first axis to provide phase encoding of spins in the third slice;
a second frequency encoding gradient produce along the second axis to form a third echo signal at a third echo time, wherein the third echo signal is associated with spins in the third slice; and
further comprising acquiring third data from the third echo signal with the MRI system, the third data being associated with the third slice.

13. The method as recited in claim 1, further comprising:
estimating k-t space weights from the first data and the second data using a computer system;
providing to the computer system magnetic resonance data acquired by interleaved data acquisition between two different orthogonal imaging planes such that the magnetic resonance data represent an undersampled k-t space; and
reconstructing images from the magnetic resonance data using a reconstruction kernel that applies the k-t-space weights to the magnetic resonance data.

14. The method as recited in claim 13, wherein the magnetic resonance data are non-T1-weighted data.

15. The method as recited in claim 14, wherein the other magnetic resonance data are acquired with a balanced steady-state free precession (bSSFP) pulse sequence that alternates excitation and data acquisition between the two different orthogonal imaging planes.

16. The method as recited in claim 13, wherein the magnetic resonance data sample k-space with a different k-space trajectory than the first data and the second data.

17. The method as recited in claim 16, wherein the first data and the second data sample k-space with a Cartesian trajectory and the magnetic resonance data sample k-space with one of a radial trajectory or a spiral trajectory.

18. The method as recited in claim 1, wherein the first data and the second data are acquired using an extended readout gradient.

19. The method as recited in claim 18, wherein the first data and the second data are acquired using simultaneous image refocusing.

20. The method as recited in claim 1, wherein the first data and the second data are acquired using a readout gradient that forms the first echo signal and the second echo signal as combined echo signals.

21. The method as recited in claim 1, wherein the pulse sequence further includes a crusher gradient applied along the third axis before the frequency encoding gradient is applied in order to crush a free induction decay pathway for both the first slice and the second slice.

22. The method as recited in claim 1, wherein the pulse sequence includes a spoiled gradient (SPGR) pulse sequence, such that the first data and the second data are T1-weighted data.

23. The method as recited in claim 1, wherein the pulse sequence includes a time-reversed fast imaging with steady-state precession (FISP) pulse sequence, such that the first data and the second data are T2-weighted data.

24. A method for producing low latency three-dimensional volumes using a magnetic resonance imaging (MRI) system, the steps of the method comprising:
(a) acquiring k-space data from a plurality of different slices in a subject using an MRI system;
(b) estimating a motion surrogate signal from the k-space data acquired in step (a) that were sampled within a threshold distance from a center of k-space;
(c) providing an average respiratory waveform associated with the subject;
(d) generating low latency three-dimensional volumes based on a relation of the motion surrogate signal and the average respiratory waveform.

25. The method as recited in claim 24, wherein step (c) includes retrospectively binning the k-space data into respiratory phase bins using the estimated motion surrogate signal and computing the average respiratory waveform by interpolating an average motion surrogate signal value over the respiratory phase bins to a higher temporal resolution.

26. The method as recited in claim 25, wherein step (d) includes determining a maximum relation value between the motion surrogate signal and the average respiratory waveform and using the maximum relation value and the respiratory phase bin associated with maximum relation value to generate a low latency three-dimensional volume.

27. The method as recited in claim 26, wherein the maximum relation value is a maximum correlation value.

28. The method as recited in claim 27, wherein the low latency three-dimensional volume generated for a given time point is generated by, $$I_i = C_{max} \text{Bin}_{max} + (1 - C_{max}) I_{i-1};$$

wherein $I_i$ is the low latency three-dimensional volume generated for the given time point, i;
$C_{max}$ is the maximum correlation value;
$\text{Bin}_{max}$ is the respiratory phase bin associated with maximum relation value; and
$I_{i-1}$ is a low latency three-dimensional volume generated for a previous time point, i−1.

29. The method as recited in claim 24, wherein the k-space data are acquired using a radial CAIPIRINHA method that simultaneously acquires k-space data from the plurality of different slices along radial spoke k-space trajectories.

30. The method as recited in claim 29, wherein the motion surrogate signal is estimated from the k-space data sampled at the center of k-space data by the radial spoke k-space trajectories.

31. The method as recited in claim 24, wherein the plurality of different slices includes at least a first slice depicting a first image plane and a second slice depicting a second image plane that is orthogonal to the first image plane, and wherein the k-space data are acquired by acquiring k-space data from the first image plane and the second image plane by slice encoding spins in the first image plane using magnetic field gradients applied along a first axis and phase encoding the spins in the first image plane using magnetic field gradients applied along a second axis that is orthogonal to the first axis, while slice encoding spins in the second image plane using magnetic field gradients applied along the second axis and phase encoding the spins in the second image plane using magnetic field gradients applied along the first axis.

32. The method as recited in claim 31, wherein the motion surrogate signal is estimated by producing a pseudo-projection from the k-space data that were sampled within the threshold distance from the center of k-space and producing the motion surrogate signal from a waveform over time extracted from the pseudo-projection.

33. The method as recited in claim 24, wherein step (d) includes determining the relation of the motion surrogate signal and the average respiratory waveform based on at least one of a correlation, a root-mean-square, or a regression.

34. The method as recited in claim 24, further comprising calculating an accumulated dose based at least in part on the generated low latency three-dimensional volumes.

35. The method as recited in claim 24, further comprising providing the generated low latency three-dimensional volumes to a radiation treatment planning system to provide real-time adaptation of a radiation treatment plan.

36. A method for acquiring magnetic resonance data using a magnetic resonance imaging (MRI) system, the steps of the method comprising:
(a) performing a pulse sequence with the MRI system, wherein the pulse sequence includes:
a first radio frequency (RF) excitation pulse that excites spins in a first slice;
a first slice encoding gradient produced along a first axis and contemporaneous with the first RF excitation pulse to provide slice encoding of the spins in the first slice;
a second RF excitation pulse that excites spins in a second slice that is orthogonal to the first slice;
a second slice encoding gradient produced along a second axis that is orthogonal to the first axis and contemporaneous with the second RF excitation pulse to provide slice encoding of the spins in the second slice;
a first phase encoding gradient produced along the first axis to provide phase encoding of spins in the second slice;
a second phase encoding gradient produced along the second axis to provide phase encoding of spins in the first slice;
a frequency encoding gradient produced along a third axis that is orthogonal to the first axis and the second axis, and that forms a first echo signal at a first echo time and a second echo signal at a second echo time, wherein the first echo signal is associated with spins in the first slice and the second echo signal is associated with spins in the second slice;
wherein the pulse sequence further comprises:
a third RF excitation pulse that excites spins in a third slice that is orthogonal to the first slice and the second slice;
a third slice encoding gradient produced along the third axis and contemporaneous with the third RF excitation pulse to provide slice encoding of the spins in the third slice;
a third phase encoding gradient produced along the first axis to provide phase encoding of spins in the third slice;

a second frequency encoding gradient produce along the second axis to form a third echo signal at a third echo time, wherein the third echo signal is associated with spins in the third slice;

(b) acquiring first data from the first echo signal with the MRI system, the first data being associated with the first slice;

(c) acquiring second data from the second echo signal with the MRI system, the second data being associated with the second slice; and (d) acquiring third data from the third echo signal with the MRI system, the third data being associated with the third slice.

37. The method as recited in claim 36, wherein the first echo occurs before the second echo.

38. The method as recited in claim 36, wherein the first echo occurs after the second echo.

39. The method as recited in claim 36, wherein the first echo time and the second echo time are equal.

40. The method as recited in claim 36, wherein the first echo time and the second echo time are not equal.

41. A method for acquiring magnetic resonance data using a magnetic resonance imaging (MRI) system, the steps of the method comprising:

(a) performing a pulse sequence with the MRI system, wherein the pulse sequence includes:
a first radio frequency (RF) excitation pulse that excites spins in a first slice;
a first slice encoding gradient produced along a first axis and contemporaneous with the first RF excitation pulse to provide slice encoding of the spins in the first slice;
a second RF excitation pulse that excites spins in a second slice that is orthogonal to the first slice;
a second slice encoding gradient produced along a second axis that is orthogonal to the first axis and contemporaneous with the second RF excitation pulse to provide slice encoding of the spins in the second slice;
a first phase encoding gradient produced along the first axis to provide phase encoding of spins in the second slice;
a second phase encoding gradient produced along the second axis to provide phase encoding of spins in the first slice;
a frequency encoding gradient produced along a third axis that is orthogonal to the first axis and the second axis, and that forms a first echo signal at a first echo time and a second echo signal at a second echo time, wherein the first echo signal is associated with spins in the first slice and the second echo signal is associated with spins in the second slice;

(b) acquiring first data from the first echo signal with the MRI system, the first data being associated with the first slice;

(c) acquiring second data from the second echo signal with the MRI system, the second data being associated with the second slice; and wherein the first echo time and the second echo time are equal.

42. The method as recited in claim 41, wherein the first echo occurs before the second echo.

43. The method as recited in claim 41, wherein the first echo occurs after the second echo.

44. A method for acquiring magnetic resonance data using a magnetic resonance imaging (MRI) system, the steps of the method comprising:

(a) performing a pulse sequence with the MRI system, wherein the pulse sequence includes:
a first radio frequency (RF) excitation pulse that excites spins in a first slice;
a first slice encoding gradient produced along a first axis and contemporaneous with the first RF excitation pulse to provide slice encoding of the spins in the first slice;
a second RF excitation pulse that excites spins in a second slice that is orthogonal to the first slice;
a second slice encoding gradient produced along a second axis that is orthogonal to the first axis and contemporaneous with the second RF excitation pulse to provide slice encoding of the spins in the second slice;
a first phase encoding gradient produced along the first axis to provide phase encoding of spins in the second slice;
a second phase encoding gradient produced along the second axis to provide phase encoding of spins in the first slice;
a frequency encoding gradient produced along a third axis that is orthogonal to the first axis and the second axis, and that forms a first echo signal at a first echo time and a second echo signal at a second echo time, wherein the first echo signal is associated with spins in the first slice and the second echo signal is associated with spins in the second slice;

(b) acquiring first data from the first echo signal with the MRI system, the first data being associated with the first slice;

(c) acquiring second data from the second echo signal with the MRI system, the second data being associated with the second slice; and wherein the first echo time and the second echo time are not equal.

45. The method as recited in claim 44, wherein the first echo occurs before the second echo.

46. The method as recited in claim 44, wherein the first echo occurs after the second echo.

47. A method for acquiring magnetic resonance data using a magnetic resonance imaging (MRI) system, the steps of the method comprising:

(a) performing a pulse sequence with the MRI system, wherein the pulse sequence includes:
a first radio frequency (RF) excitation pulse that excites spins in a first slice;
a first slice encoding gradient produced along a first axis and contemporaneous with the first RF excitation pulse to provide slice encoding of the spins in the first slice;
a second RF excitation pulse that excites spins in a second slice that is orthogonal to the first slice;
a second slice encoding gradient produced along a second axis that is orthogonal to the first axis and contemporaneous with the second RF excitation pulse to provide slice encoding of the spins in the second slice;
a first phase encoding gradient produced along the first axis to provide phase encoding of spins in the second slice;
a second phase encoding gradient produced along the second axis to provide phase encoding of spins in the first slice;
a frequency encoding gradient produced along a third axis that is orthogonal to the first axis and the second axis, and that forms a first echo signal at a first echo time and a second echo signal at a second echo time, wherein the first echo signal is associated with spins in the first slice and the second echo signal is associated with spins in the second slice;

(b) acquiring first data from the first echo signal with the MRI system, the first data being associated with the first slice;

(c) acquiring second data from the second echo signal with the MRI system, the second data being associated with the second slice; and wherein the first echo occurs before the second echo.

48. A method for acquiring magnetic resonance data using a magnetic resonance imaging (MRI) system, the steps of the method comprising:

(a) performing a pulse sequence with the MRI system, wherein the pulse sequence includes:

a first radio frequency (RF) excitation pulse that excites spins in a first slice;

a first slice encoding gradient produced along a first axis and contemporaneous with the first RF excitation pulse to provide slice encoding of the spins in the first slice;

a second RF excitation pulse that excites spins in a second slice that is orthogonal to the first slice;

a second slice encoding gradient produced along a second axis that is orthogonal to the first axis and contemporaneous with the second RF excitation pulse to provide slice encoding of the spins in the second slice;

a first phase encoding gradient produced along the first axis to provide phase encoding of spins in the second slice;

a second phase encoding gradient produced along the second axis to provide phase encoding of spins in the first slice;

a frequency encoding gradient produced along a third axis that is orthogonal to the first axis and the second axis, and that forms a first echo signal at a first echo time and a second echo signal at a second echo time, wherein the first echo signal is associated with spins in the first slice and the second echo signal is associated with spins in the second slice;

(b) acquiring first data from the first echo signal with the MRI system, the first data being associated with the first slice;

(c) acquiring second data from the second echo signal with the MRI system, the second data being associated with the second slice;

(d) estimating k-t space weights from the first data and the second data using a computer system;

(e) providing to the computer system magnetic resonance data acquired by interleaved data acquisition between two different orthogonal imaging planes such that the magnetic resonance data represent an undersampled k-t space; and (f) reconstructing images from the magnetic resonance data using a reconstruction kernel that applies the k-t-space weights to the magnetic resonance data.

49. A method for acquiring magnetic resonance data using a magnetic resonance imaging (MRI) system, the steps of the method comprising:

(a) performing a pulse sequence with the MRI system, wherein the pulse sequence includes:

a first radio frequency (RF) excitation pulse that excites spins in a first slice;

a first slice encoding gradient produced along a first axis and contemporaneous with the first RF excitation pulse to provide slice encoding of the spins in the first slice;

a second RF excitation pulse that excites spins in a second slice that is orthogonal to the first slice;

a second slice encoding gradient produced along a second axis that is orthogonal to the first axis and contemporaneous with the second RF excitation pulse to provide slice encoding of the spins in the second slice;

a first phase encoding gradient produced along the first axis to provide phase encoding of spins in the second slice;

a second phase encoding gradient produced along the second axis to provide phase encoding of spins in the first slice;

a frequency encoding gradient produced along a third axis that is orthogonal to the first axis and the second axis, and that forms a first echo signal at a first echo time and a second echo signal at a second echo time, wherein the first echo signal is associated with spins in the first slice and the second echo signal is associated with spins in the second slice;

(b) acquiring first data from the first echo signal with the MRI system, the first data being associated with the first slice;

(c) acquiring second data from the second echo signal with the MRI system, the second data being associated with the second slice; and wherein the pulse sequence includes a spoiled gradient (SPGR) pulse sequence, such that the first data and the second data are T1-weighted data.

* * * * *